US009018081B2

(12) United States Patent
Crowder et al.

(10) Patent No.: US 9,018,081 B2
(45) Date of Patent: Apr. 28, 2015

(54) LIGHT EMITTING DIODE (LED) USING THREE-DIMENSIONAL GALLIUM NITRIDE (GAN) PILLAR STRUCTURES

(71) Applicant: Sharp Laboratories of America, Inc., Camas, WA (US)

(72) Inventors: Mark Albert Crowder, Portland, OR (US); Changqing Zhan, Vancouver, OR (US); Paul J. Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 14/088,374

(22) Filed: Nov. 23, 2013

(65) Prior Publication Data

US 2014/0077158 A1    Mar. 20, 2014

Related U.S. Application Data

(63) Continuation of application No. 13/367,120, filed on Feb. 6, 2012, now Pat. No. 8,648,328, which is a continuation-in-part of application No. 13/337,843, filed on Dec. 27, 2011, now Pat. No. 8,685,774.

(51) Int. Cl.
| | |
|---|---|
| H01L 33/04 | (2010.01) |
| H01L 33/18 | (2010.01) |
| H01L 33/24 | (2010.01) |
| H01L 33/32 | (2010.01) |
| H01L 33/00 | (2010.01) |

(52) U.S. Cl.
CPC ............... *H01L 33/04* (2013.01); *H01L 33/18* (2013.01); *H01L 33/24* (2013.01); *H01L 33/32* (2013.01); *H01L 33/0075* (2013.01)

(58) Field of Classification Search
CPC ......... H01L 33/08; H01L 33/44; H01L 33/42; H01L 33/32

USPC .............................. 257/13, 76, 9, 77, 79, 103
See application file for complete search history.

(56) References Cited

U.S. PATENT DOCUMENTS

| | | | |
|---|---|---|---|
| 6,536,106 B1 | 3/2003 | Jackson et al. | |
| 6,687,987 B2 | 2/2004 | Mayer et al. | |
| 7,968,474 B2 | 6/2011 | Martin et al. | |
| 2006/0273328 A1* | 12/2006 | Niu et al. | 257/79 |
| 2009/0309107 A1* | 12/2009 | Kang | 257/88 |

FOREIGN PATENT DOCUMENTS

JP    2007067182 A  *  3/2007

OTHER PUBLICATIONS

Freer et al., High-Yield self-limiting single-nanowire assembly with dielectrophoresis, Nat Nano 5, pp. 525-530, 2010.

* cited by examiner

*Primary Examiner* — Kenneth Parker
*Assistant Examiner* — Bo Fan
(74) *Attorney, Agent, or Firm* — Law Office of Gerald Maliszewski; Gerald Maliszewski

(57) ABSTRACT

A method is provided for fabricating a light emitting diode (LED) using three-dimensional gallium nitride (GaN) pillar structures with planar surfaces. The method forms a plurality of GaN pillar structures, each with an n-doped GaN (n-GaN) pillar and planar sidewalls perpendicular to the c-plane, formed in either an m-plane or a-plane family. A multiple quantum well (MQW) layer is formed overlying the n-GaN pillar sidewalls, and a layer of p-doped GaN (p-GaN) is formed overlying the MQW layer. The plurality of GaN pillar structures are deposited on a first substrate, with the n-doped GaN pillar sidewalls aligned parallel to a top surface of the first substrate. A first end of each GaN pillar structure is connected to a first metal layer. The second end of each GaN pillar structure is etched to expose the n-GaN pillar second end and connected to a second metal layer.

9 Claims, 27 Drawing Sheets

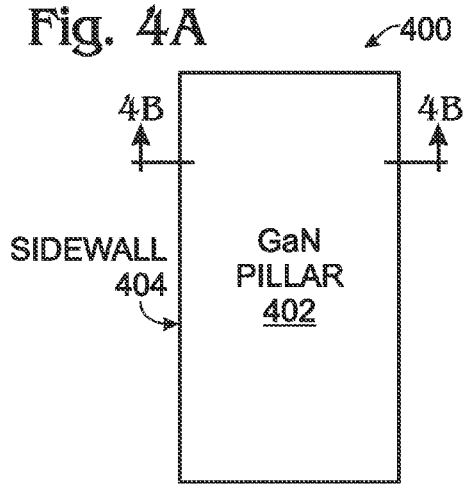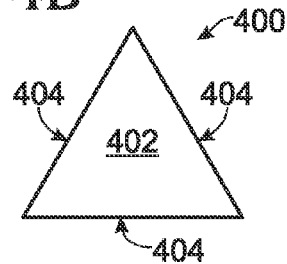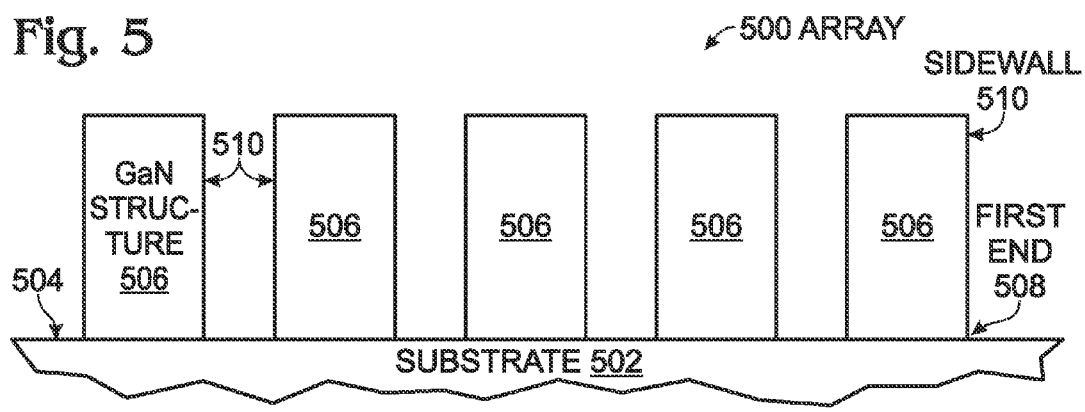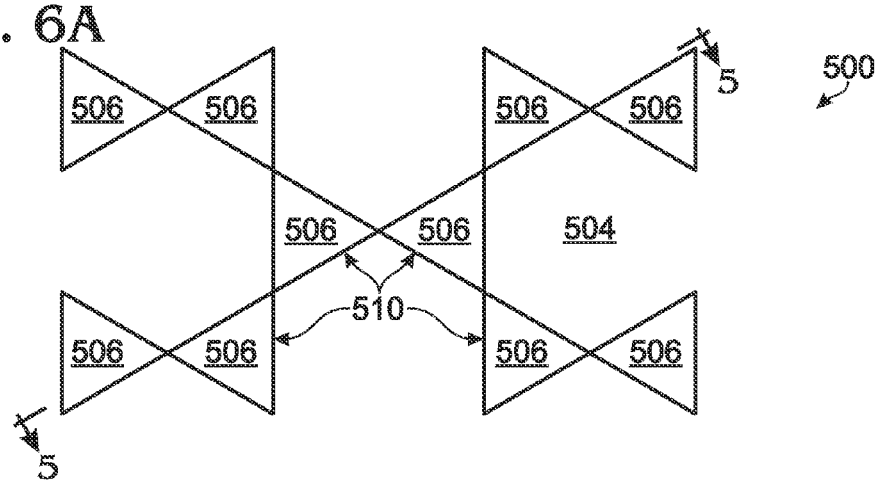

Fig. 14I
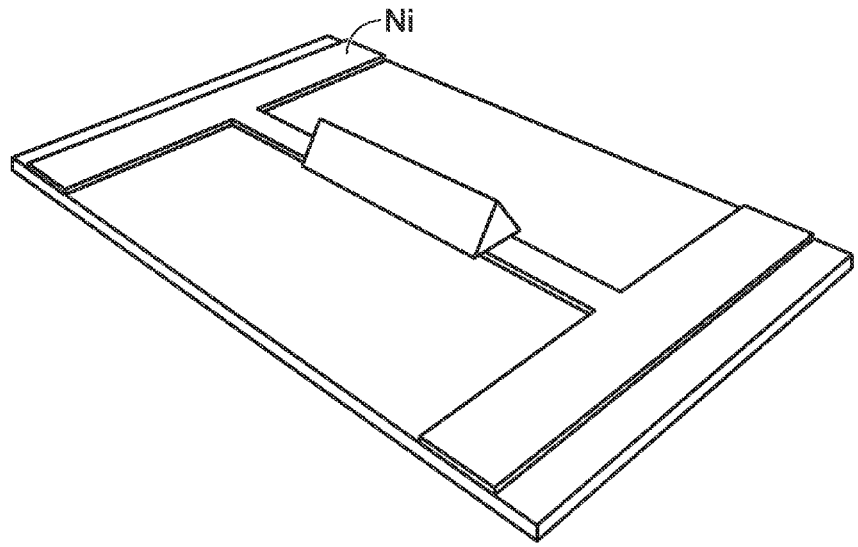
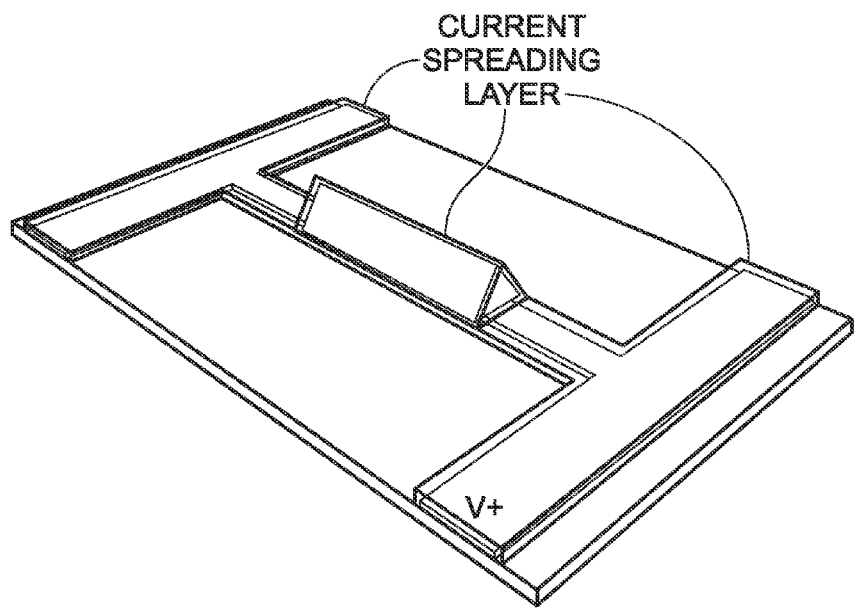

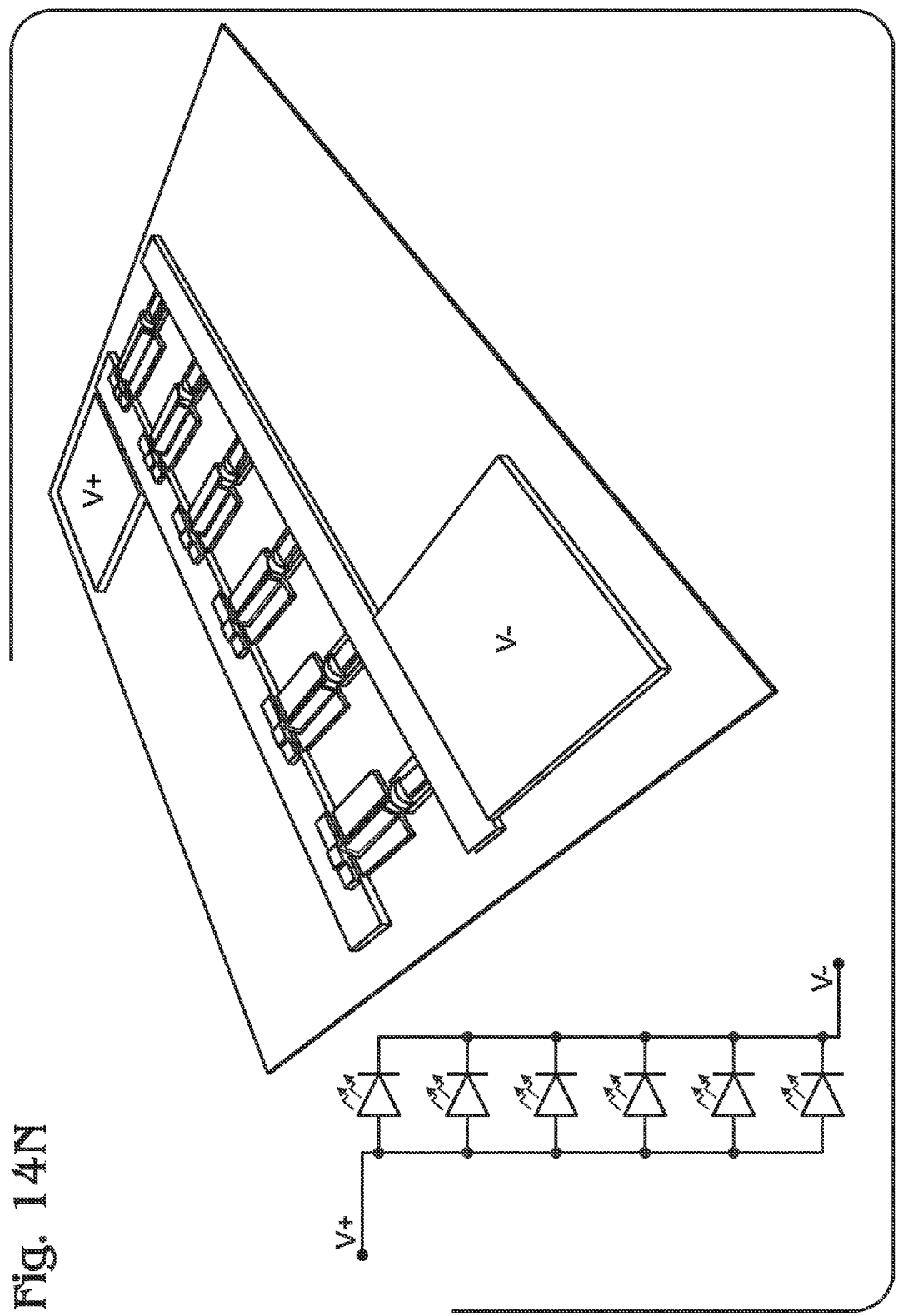

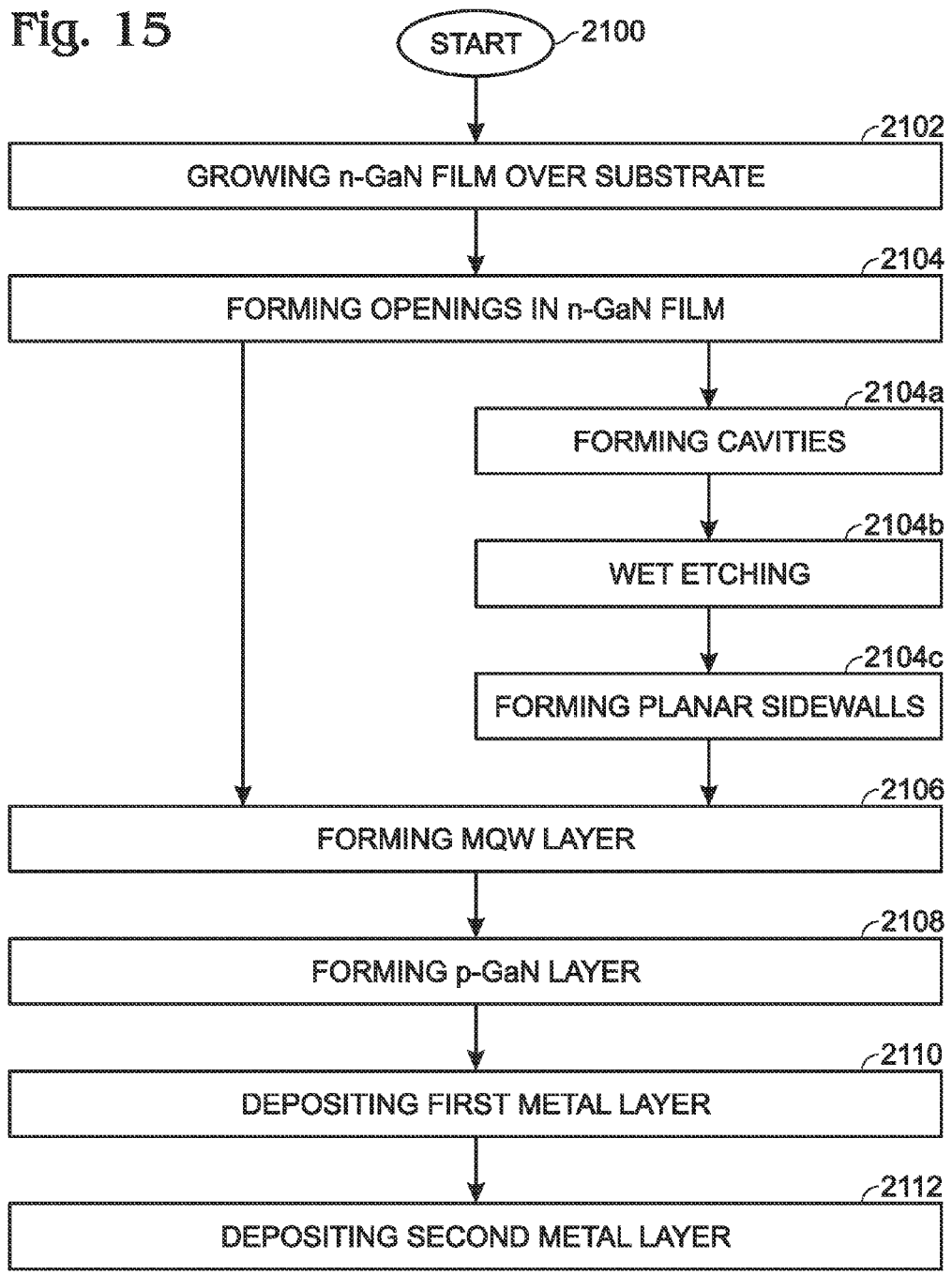

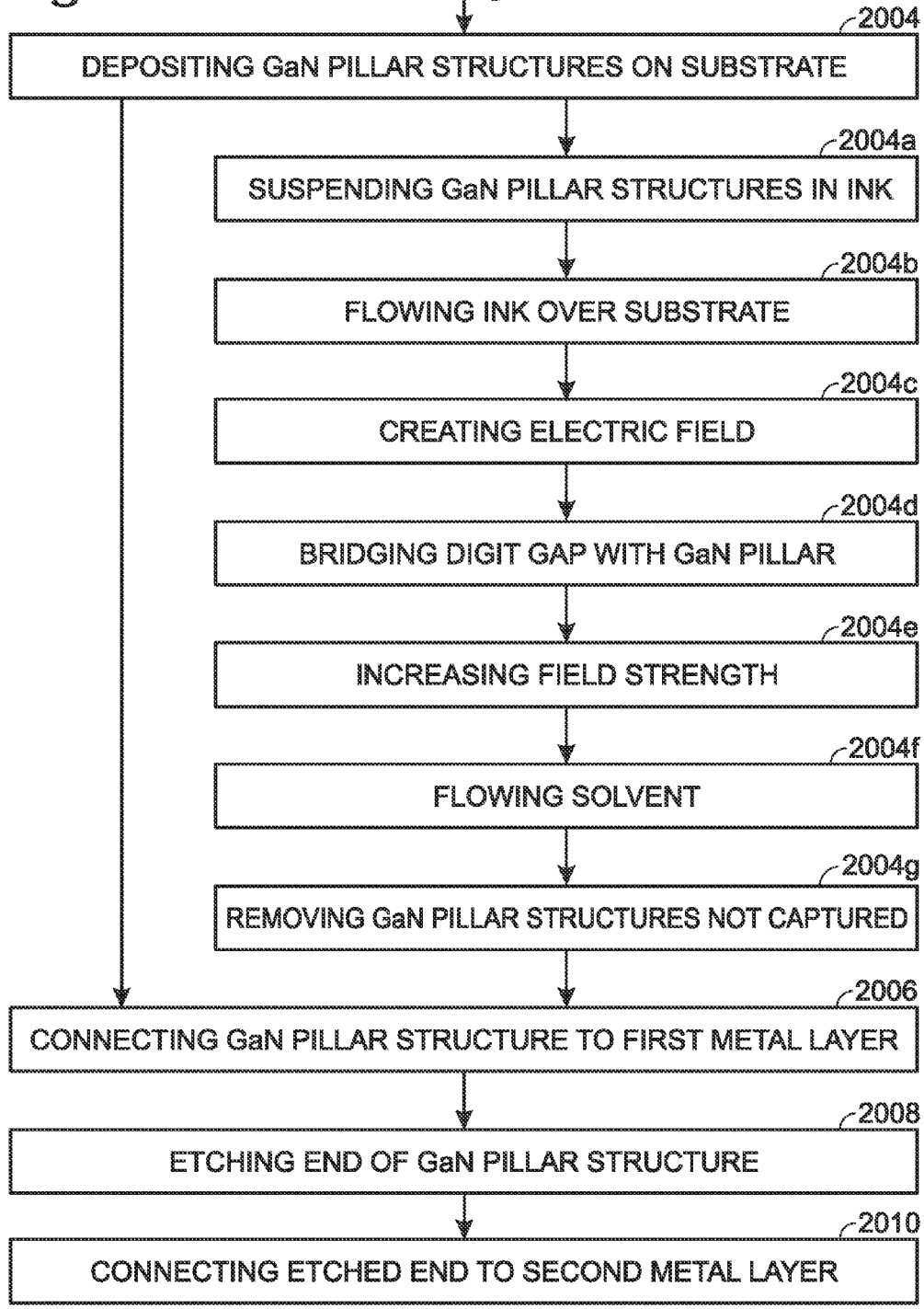

LIGHT EMITTING DIODE (LED) USING THREE-DIMENSIONAL GALLIUM NITRIDE (GAN) PILLAR STRUCTURES

RELATED APPLICATIONS

This application is a Continuation of an application entitled, LIGHT EMITTING DIODE (LED) USING THREE-DIMENSIONAL GALLIUM NITRIDE (GaN) PILLAR STRUCTURES WITH PLANAR SURFACES, invented by M. Albert Crowder et al., Ser. No. 13/367,120, filed Feb. 6, 2012;

which is a Continuation-in-Part of an application entitled, METHOD FOR FABRICATING THR EE-DIMENSIONAL GALLIUM NITRIDE STRUCTURES WITH PLANAR SURFACES, invented by M. Albert Crowder et al., Ser. No. 13/337,843, filed Dec. 27, 2011. Both these applications are incorporated herein by reference.

BACKGROUND OF THE INVENTION

1. Field of the Invention

This invention generally relates to light emitting diode (LED) fabrication processes and, more particularly, to a method for fabricating three-dimensional (3D) gallium nitride structures with planar surfaces for use in LEDs.

2. Description of the Related Art

FIG. 1 is a partial cross-sectional view of a planar gallium nitride LED (prior art). Gallium nitride (GaN) is widely used for LED applications due to its favorable band-gap and direct band structure, and most fabrication follows a planar metalorganic chemical vapor deposition (MOCVD) sequence, as noted by Nguyen, X. L., Nguyen, T. N. N., Chau, V. T. & Dang, M. C., "The fabrication of GaN-based light emitting diodes (LEDs)", Adv. Nat. Sci: Nanosci. Nanotechnol. 1, 025015 (2010), as follows:

1) A thick n-GaN with Si doping is deposited on a sapphire substrate;
2) A multiple quantum well (MQW) layer is formed consisting of alternating thin layers of InGaN and AlGaN; and,
3) A thin p-GaN layer is formed with Mg doping.

One of the constraints on this technology is the high cost of producing GaN for devices due to the difficulties encountered in forming a sufficient high-quality material. These difficulties primarily stem from the growth process, which is typically conducted at very high temperatures (e.g., over 1,000° C.) in molecular beam epitaxy (MBE) or MOCVD reactors and on substrates with a different coefficient of thermal expansion (CTE). The difference in CTE can lead to formation of threading dislocations that adversely affect device performance and reliability. In addition, film stress limits the amount of dopants that can be incorporated in a GaN film, which in turn limits the range of emission characteristics that are achievable. So it would be desirable to improve the defect density and increase the amount of device surface area that can produce LED emission for a given area of growth substrate.

FIGS. 2A through 2C are partial cross-sectional views of LED devices with textured surfaces (prior art). FIG. 2A depicts a planar LED, FIG. 2B depicts a flip chip LED, and FIG. 2C depicts a textured template LED. One other consideration of the planar LED structure is the high index of refraction of GaN, which limits the amount of light that can be emitted to a narrow angular cone. Light outside the escape cone is reflected internally, diminishing the efficiency of the device. A variety of ways have been devised to enhance the roughness of the encapsulation layer on planar devices as a means to allow more light to escape, see Fujii, T. et al., "Increase in the extraction efficiency of GaN-based light-emitting diodes via surface roughening", Applied Physics Letters 84, 855 (2004), and the dry etch texturing study of Lee, H. C. et al., "Effect of the surface texturing shapes fabricated using dry etching on the extraction efficiency of vertical light-emitting diodes", Solid-State Electronics 52, 1193-1196 (2008). Nanostructured surface coatings have also been used in a similar way to extract internal reflections (Kang, J. W. et al., "Improved Light Extraction of GaN-Based Green Light-Emitting Diodes with an Antireflection Layer of ZnO Nanorod Arrays", Electrochem. Solid-State Lett. 14, H120-H123 (2011).

FIGS. 3A and 3B depict, respectively, a GaN micro-rod LED structure and a device fabricated from an array of micro-rod LEDs (prior art). One method to alleviate the problems with planar device fabrication is to use GaN nanowires or micro-rods (μ-rods). Such structures can be fabricated at high temperature with the appropriate shell structures to form a p-QW-n LED, harvested from the growth substrate, and deposited using a dielectrophoresis (i.e., e-field) process. GaN μ-rods provide a non-planar template, often in the form of a hexagonal or triangular rod, for the epitaxial growth of quantum well (QW) structures. The divergence from planar should provide a higher efficiency for light extraction. The diameter of the μ-rods and nanowires is typically small enough that the threading dislocation density is significantly reduced, increasing the internal quantum efficiency (IQE) and lifetime. By controlling the crystallographic orientation of the GaN μ-rods, non-polar or semi-polar planes can be used for device fabrication, thereby reducing the effect of the quantum confined stark effect (QCSE), which, in turn, can also lead to improvements in the IQE.

Several research groups have worked on the development of GaN nanowires to varying degrees of success. One approach that yields high-quality GaN nanowires was developed by UNM researchers, and uses MOCVD epitaxial growth from a templated substrate (S. D. Hersee, et al., "The controlled growth of GaN nanowires", Nano Letters 6, 1808 (2006). This process yielded good nanowires with a constant diameter and a hexagonal cross-section with sidewall orientations in the (1100) family. However, the growth was limited to 2 μm per hour.

Other VLS-based growth processes have been developed using various catalysts (e.g., Ge, Au, or Fe), with resulting nanowires and nanorods being produced and fabricated into LED devices. The crystallographic orientation of VLS-grown GaN nanowires can be non-ideal, as there are competing preferred axial orientations for growth (a- and c-axis, depending on temperature), competing phases (zinc-blend and wurtzite), and the resulting nanowires can have non-uniform sidewall orientations. This can affect the uniformity of e-field dispersed GaN nanowires that are used for device fabrication.

It would be advantageous if a GaN LED could be fabricated with uniform sidewall orientations and a minimal density of defects.

SUMMARY OF THE INVENTION

Disclosed herein is a class of structures for gallium nitride (GaN) based light emitting diodes (LEDs) that have improved performance because of the 3-dimensional shape of the initial GaN template over which the LED layers are deposited. The template shape can be columnar, which forms micro-rod or pillar LEDs, and can be connected in an array to make high efficiency lighting of arbitrary size and shape. Alternatively, the template can have a series of pits that increase the emission area and improve light extraction for a planar device. Template shapes are formed by a combination of a damage etch and a wet etch that selectively removes damaged GaN, leaving high quality low etch rate crystalline planes. LED devices made from these template shapes are unlike conventional technologies that fabricate LED structures by MOCVD deposition on planar n-type GaN substrates, creating large planar devices. Further, unlike conventional devices, LED devices made from the above-mentioned templates do not require addition top surface texturing after the LED device is formed.

Accordingly, a method is provided for fabricating a LED using three-dimensional GaN pillar structures with planar surfaces. The method forms a plurality of GaN pillar structures. Each GaN pillar structure is a result of forming an n-doped GaN (n-GaN) pillar having a first end, a second end, with at least one of the ends formed in a c-plane, and planar sidewalls perpendicular to the c-plane, formed in either an m-plane or a-plane family. A multiple quantum well (MQW) layer is formed overlying the n-GaN pillar sidewalls, and a layer of p-doped GaN (p-GaN) is formed overlying the MQW layer. The plurality of GaN pillar structures are deposited on a first substrate, with the n-doped GaN pillar sidewalls aligned parallel to a top surface of the first substrate. A first end of each GaN pillar structure is connected to a first metal layer to form a first electrode. The second end of each GaN pillar structure is etched to expose the n-GaN pillar second end and connected to a second metal layer to form a second electrode.

In another aspect, the method grows an n-GaN film overlying a substrate. A plurality of openings is formed in a first region of the n-GaN film. Each opening has planar sidewalls perpendicular to a c-plane aligned with a top surface of the n-GaN film, and formed in either an m-plane or a-plane family. A MQW layer is formed overlying the first region of n-GaN film, and a layer of p-GaN is formed overlying the MQW layer. A first metal layer is deposited overlying a second region of the n-GaN film forming a first electrode. A second metal layer is deposited overlying the p-GaN film to form a second electrode.

Additional details of the above-mentioned methods, and LEDs with three-dimensional GaN pillar structures having planar surfaces, are provided below.

BRIEF DESCRIPTION OF THE DRAWINGS

FIGS. 4A and 4B are partial cross-sectional views of a GaN three-dimensional (3D) structure.

FIG. 5 is a partial cross-section view depicting a GaN 3D array.

FIGS. 6A and 6B are plan views of the array of FIG. 5.

FIG. 15 is a flowchart illustrating an alternative method for fabricating a LED using three-dimensional GaN pillar structures with planar surfaces.

FIGS. 20A and 20B are flowcharts illustrating a method for fabricating a LED using three-dimensional GaN pillar structures with planar surfaces.

DETAILED DESCRIPTION

Figure 1:
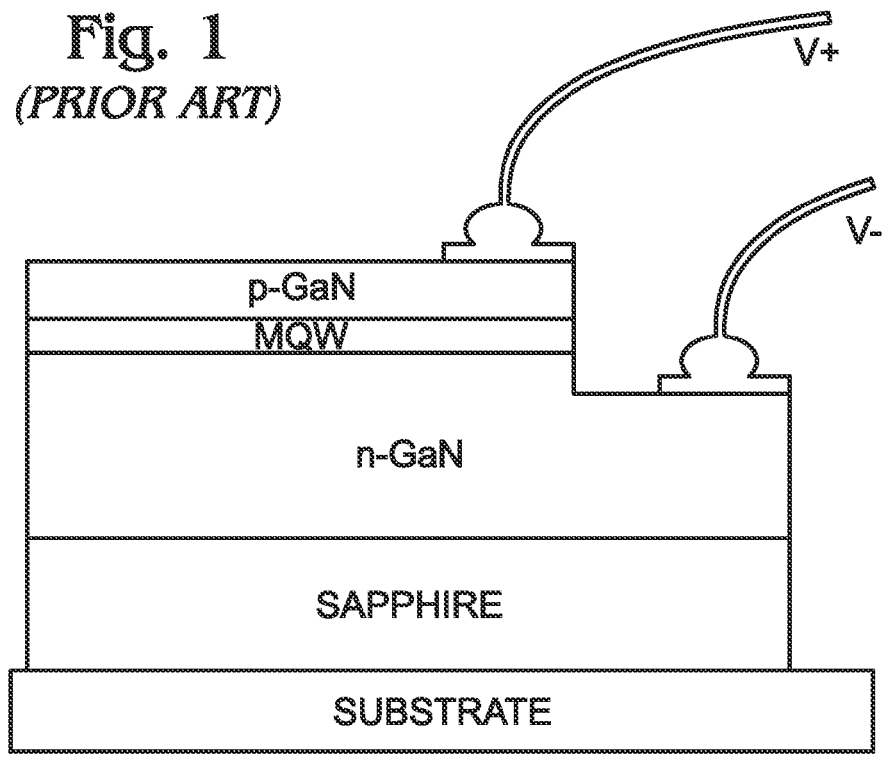
FIG. 1 is a partial cross-sectional view of a planar gallium nitride LED (prior art).
Figure 2A:
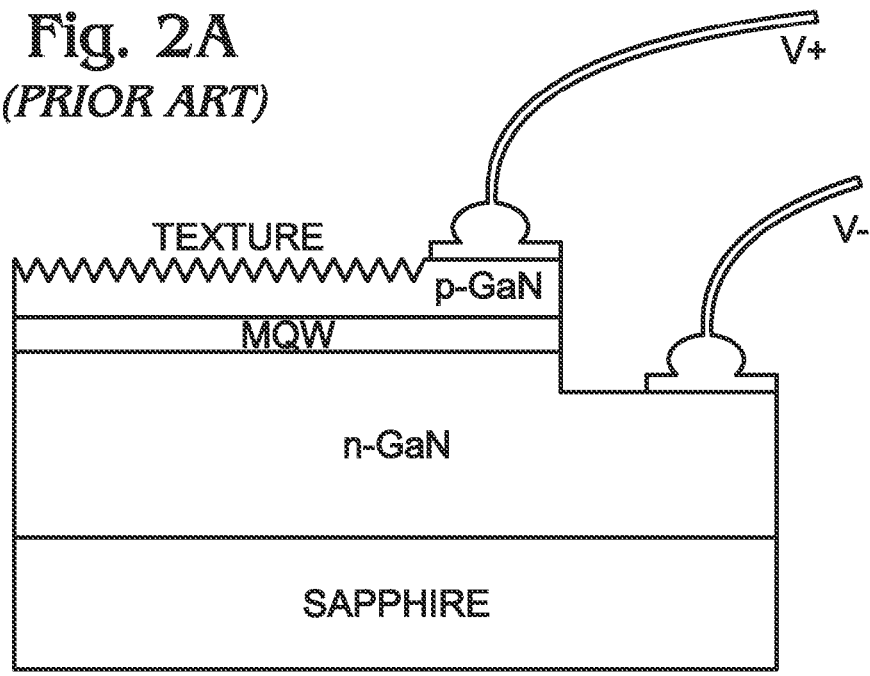
FIGS. 2A through 2C are partial cross-sectional views of LED devices with textured surfaces (prior art).
Figure 2B:
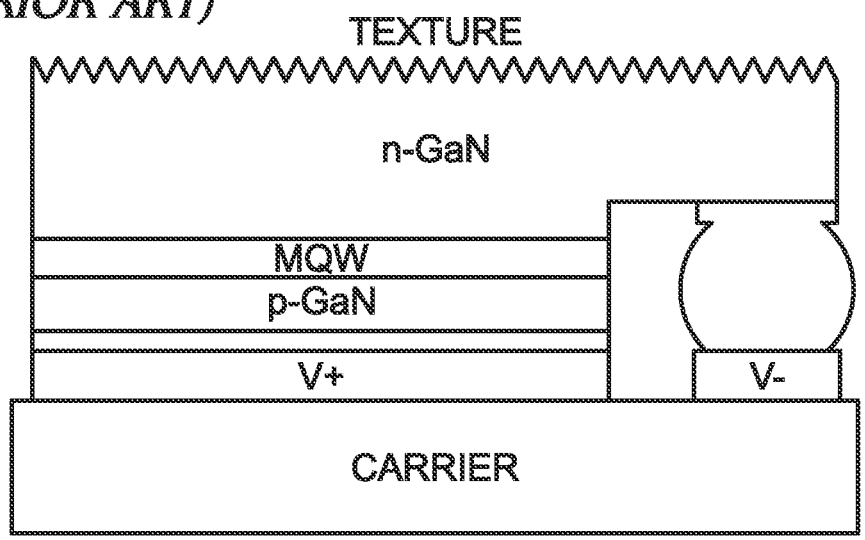
Figure 2C:
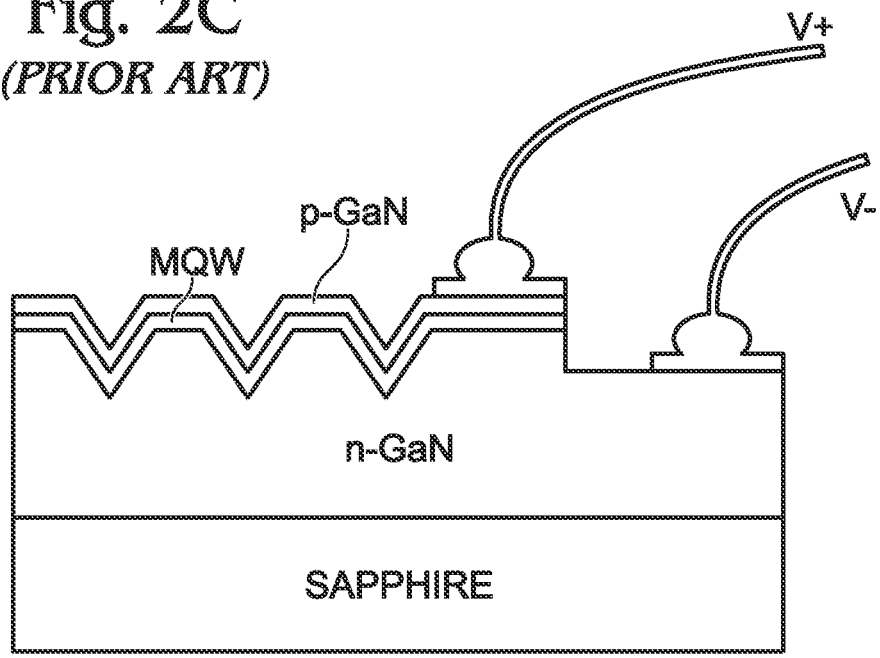
Figure 3A:
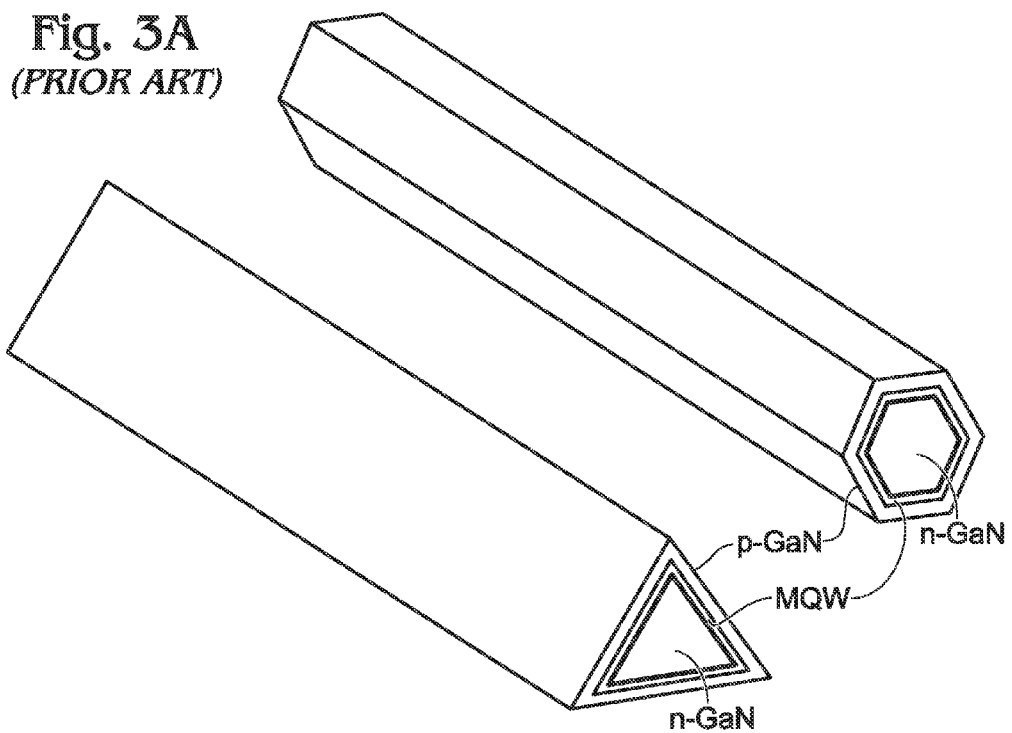
FIGS. 3A and 3B depict, respectively, a GaN micro-rod LED structure and a device fabricated from an array of micro-rod LEDs (prior art).
Figure 3B:
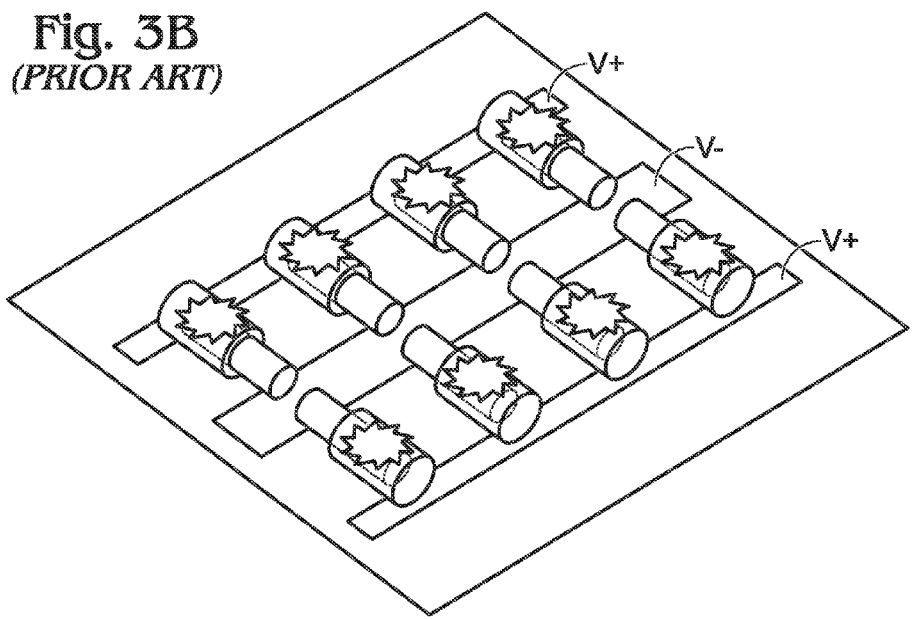

FIGS. 4A and 4B are partial cross-sectional views of a GaN three-dimensional (3D) structure. The GaN 3D structure 400 comprises a GaN pillar 402 and pillar sidewalls 404. The pillar sidewalls 404 are formed in either the m-plane ($10\bar{1}0$) or a-plane ($\bar{1}2\bar{1}0$). Each family of planes (m and a) both contain 6 faces. The 6 faces for the nm-plane family are $\{10\bar{1}0\}$, $\{\bar{1}010\}$, $\{01\bar{1}0\}$, $\{0\bar{1}10\}$, $\{\bar{1}100\}$, and $\{\bar{1}100\}$. For the a-plane family, the faces are $\{1\bar{2}10\}$, $\{\bar{1}2\bar{1}0\}$, $\{11\bar{2}0\}$, $\{2\bar{1}\bar{1}0\}$, $\{\bar{1}\bar{1}20\}$, and $\{\bar{2}110\}$. Note that for these Miller indices, families are in (parentheses), faces are in {curly brackets}, and zone axes are in [square brackets]. As shown in FIG. 4B, the GaN pillar 402 has a triangular pattern. However, hexagonally shaped pillars may alternatively be formed, see FIG. 6B.

FIG. 5 is a partial cross-section view depicting a GaN 3D array. The array 500 comprises a substrate 502 with a top surface 504, with an array of GaN structures 506. Each GaN structure 506 has a first end 508 attached to the substrate top surface 504, and sidewalls 510 formed in the m-plane or a-plane. Typically, the substrate 502 is a material such as sapphire, silicon, or silicon carbide. However, the array 500 is not limited to any particular substrate material.

Figure 6B:
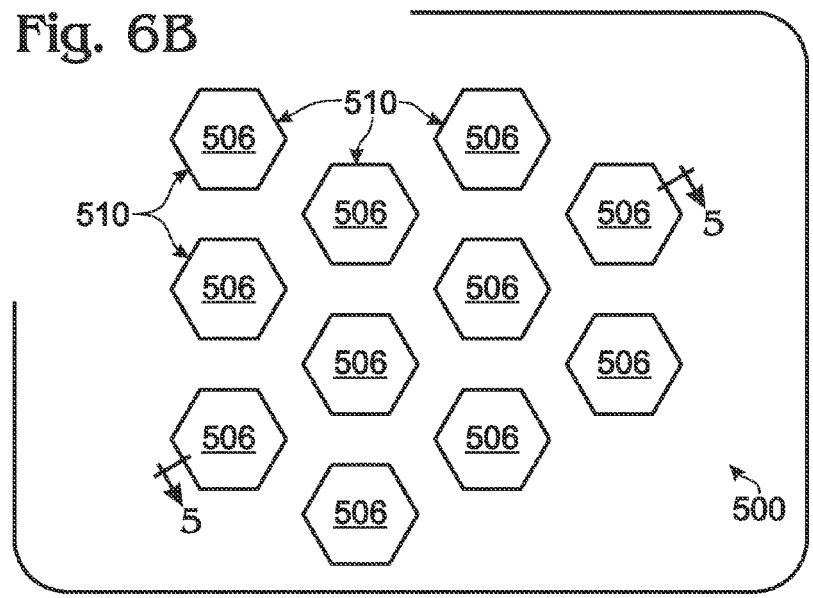

FIGS. 6A and 6B are plan views of the array of FIG. 5. The GaN structures 506 of FIG. 5 are GaN pillars. As shown in FIG. 6A, the GaN pillars or micro-rods 402 may have a triangular shape. As shown in FIG. 6B, the GaN pillars having a hexagonal shape.

Figure 16A:
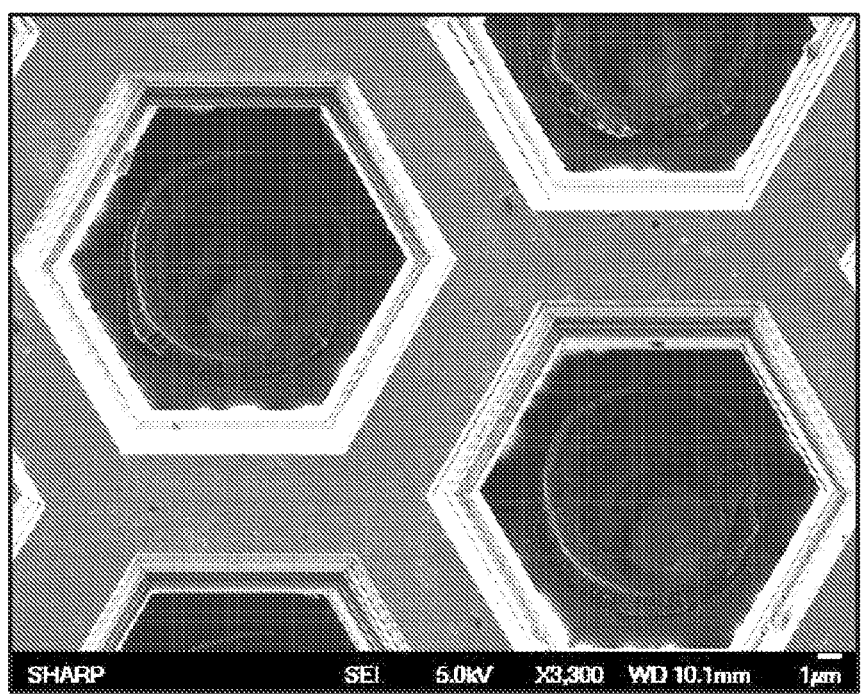
FIGS. 16A and 16B are scanning electron microscope (SEM) image representations of, respectively, a honeycomb structure and triangular etched pillars.
Figure 16B:
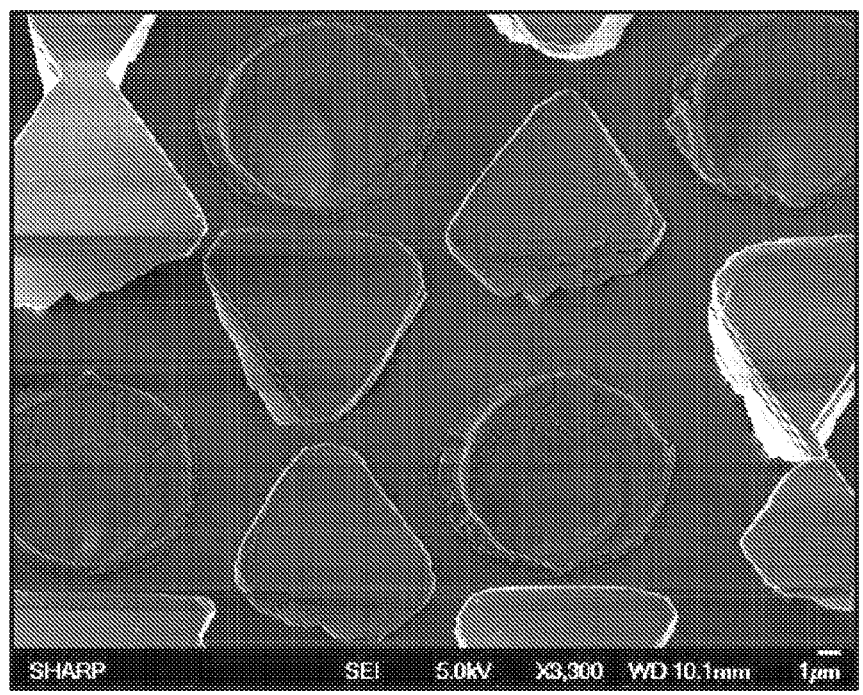
Figure 17A:
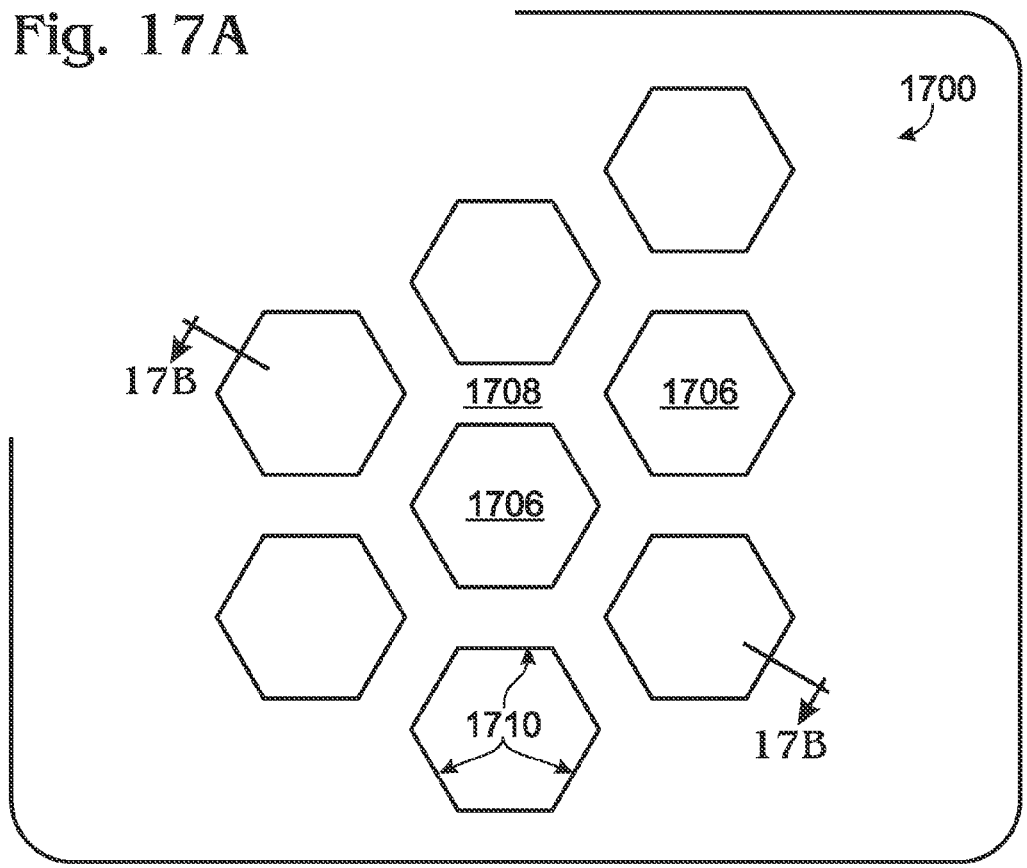
FIGS. 17A and 17B are, respectively, plan and partial cross-sectional views of another type of GaN 3D array.
Figure 17B:
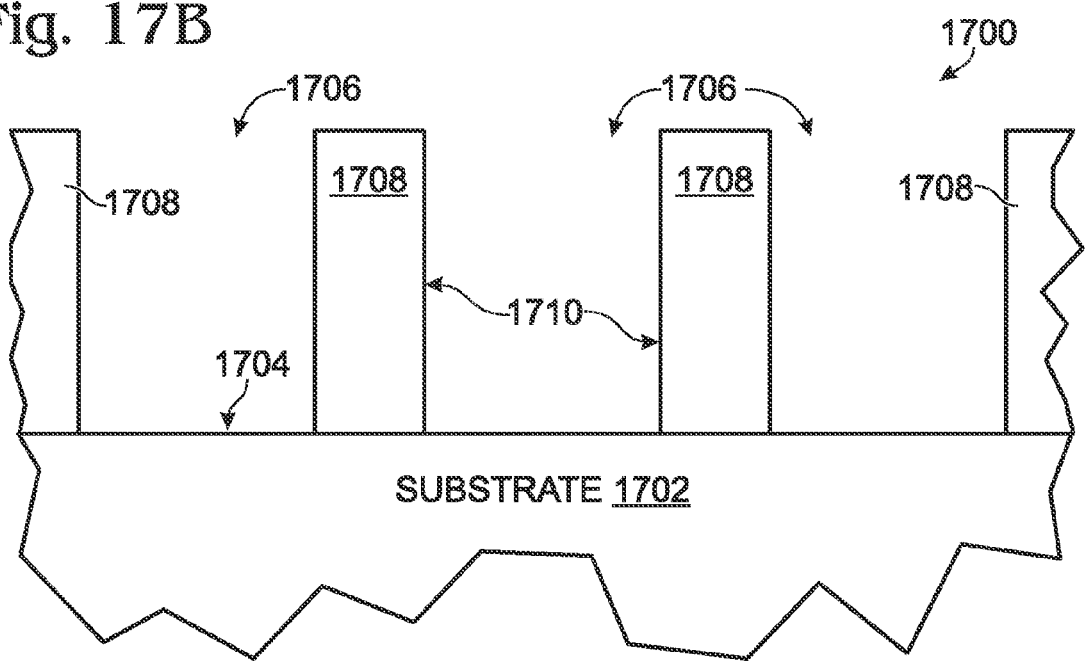

FIGS. 16A and 16B are, respectively, plan and partial cross-sectional views of another type of GaN 3D array. The array 1700 comprises a substrate 1702 with a top surface 1704. A honeycomb structure of openings 1706 are formed in a GaN film 1708. Each opening 1706 has sidewalls 1710 formed in the m-plane or a-plane. Typically, the openings 1706 formed in the GaN film 1708 have a hexagonal shape. The substrate 1702 may be sapphire, silicon, or silicon carbide.

Figure 18A:
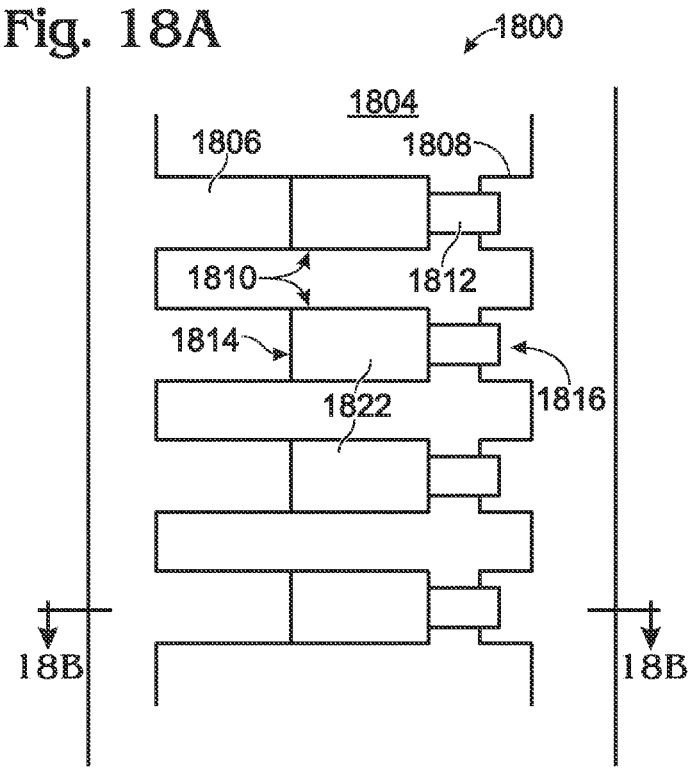
FIGS. 18A and 18B are, respectively, plan and partial cross-sectional views of a LED with three-dimensional GaN pillar structures having planar surfaces.
Figure 18B:
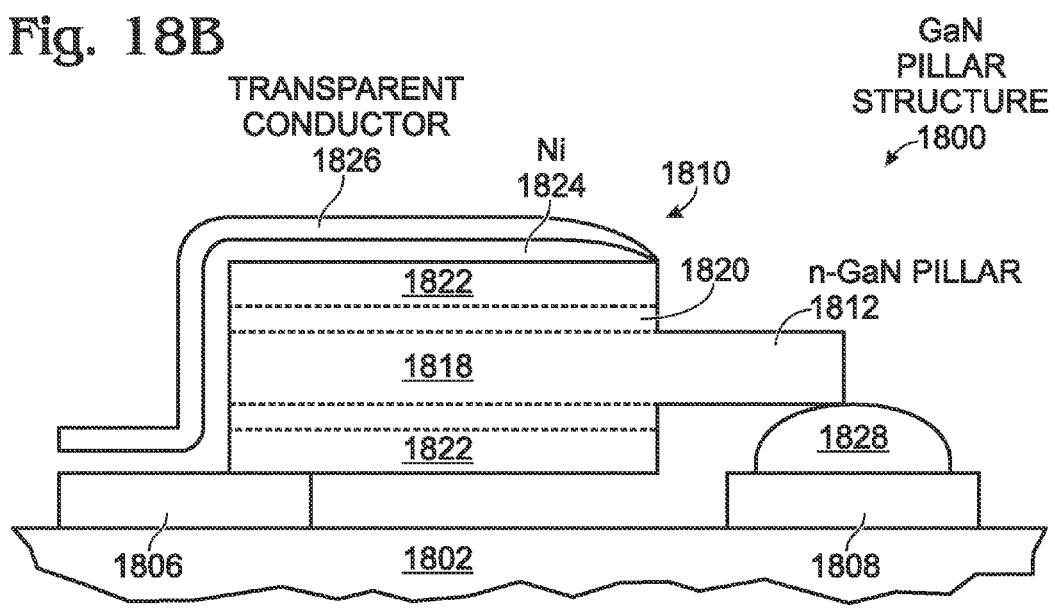

FIGS. 18A and 18B are, respectively, plan and partial cross-sectional views of a LED with three-dimensional GaN pillar structures having planar surfaces. The LED 1800 comprises a substrate 1802 with a top surface 1804 having a plurality of first electrode digits (fingers) 1806 formed in a first metal layer, and a plurality of opposing second electrode digits 1808 formed in a second metal layer. A plurality of GaN pillar structures 1810 is shown. Each GaN pillar structure 1810 bridges a gap between a first electrode digit 1806 and a corresponding second electrode digit 1808. Each GaN pillar structure 1810 comprises an n-doped GaN (n-GaN) pillar 1812 having a first end 1814 overlying a corresponding first electrode digit 1806, a second end 1816 connected to a corresponding second electrode digit 1808. At least one of the ends is formed in a c-plane. In one aspect, the second end 1816 is typically formed in the c-plane. The n-GaN pillars 1812 have planar sidewalls 1818 perpendicular to the c-plane, formed in either an m-plane and a-plane family. A multiple quantum well (MQW) layer 1820 overlies the n-GaN pillar sidewalls 1818 and the GaN pillar first end 1814. A layer of p-doped GaN (p-GaN) 1822 overlies the MQW layer 1820. As described above, the n-doped GaN pillars 1812 have either a hexagonal or triangular shape.

Optionally as shown, a thin Ni layer 1824 overlies the p-GaN layer 1822 of each GaN pillar structure 1810. A transparent conductor 1826 overlies the Ni layer 1824, so that the combination of the Ni layer 1824 and transparent conductor 1826 electrically connect the p-GaN layer 1822 of each GaN pillar structure 1810 to a corresponding first electrode digit 1806. A metal interconnect 1828 is interposed between each exposed n-GaN pillar second end 1816 and the underlying second electrode digit 1808.

Figure 19A:
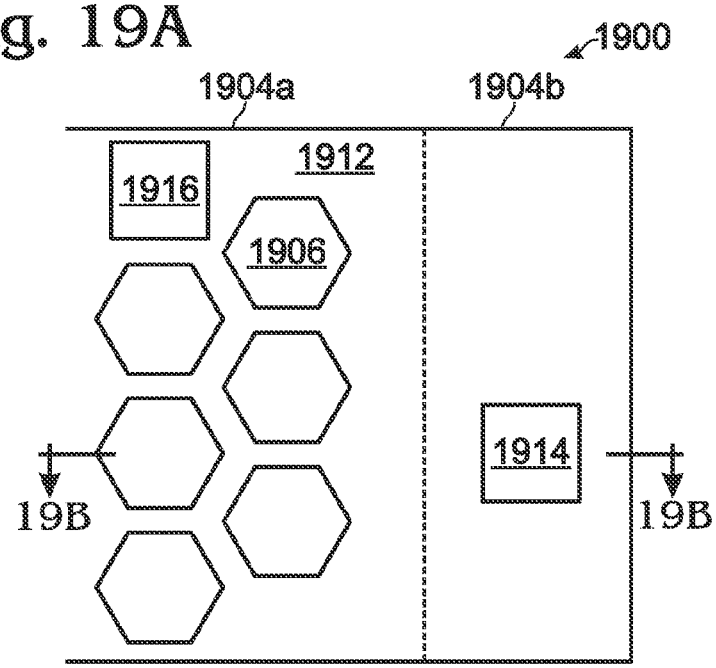
FIGS. 19A and 19B are, respectively, plan and cross-sectional views of a related type of LED with three-dimensional GaN pillar structures with planar surfaces.
Figure 19B:
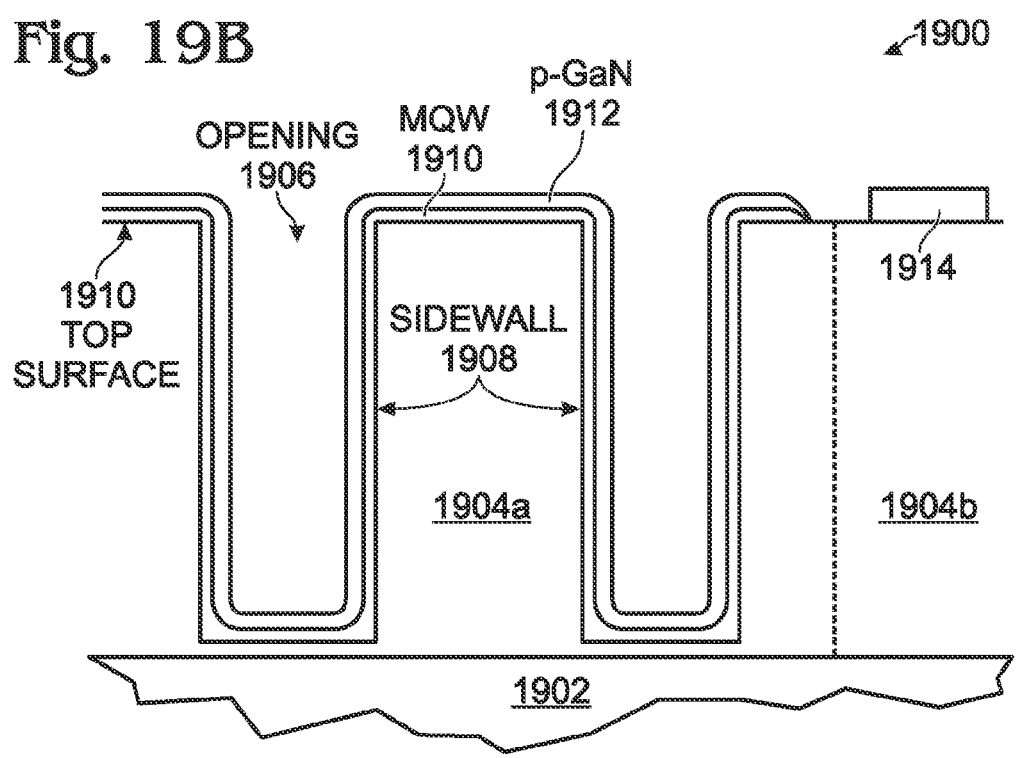

FIGS. 19A and 19B are, respectively, plan and cross-sectional views of a related type of LED with three-dimensional GaN pillar structures with planar surfaces. The LED 1900 comprises an n-GaN film overlying a substrate 1902. The n-GaN film has a first region 1904a with a plurality of openings 1906 and a second region 1904b. Typically, the openings 1906 have a hexagonal shape. Each opening 1906 has planar sidewalls 1908 perpendicular to a c-plane aligned with a top surface 1910 of the n-GaN film 1904a. The planar sidewalls 1908 are formed in either an nm-plane or a-plane family. A MQW layer 1910 overlies the n-GaN film first region 1904a. A layer of p-GaN 1912 overlies the MQW layer 1910. A first metal layer 1914 overlies the second region of n-GaN film 1904b forming a first electrode. A second metal layer 1916 overlies the p-GaN film 1912 to form a second electrode. In another aspect, the LED structure of FIGS. 19A and 19B may include an optional current spreading layer consisting of a Ni layer and a transparent conductor, as described in more detail below.

Planar GaN films deposited on sapphire substrates can be used to form etched 3-dimensional structures such as rods or cavities that can act as a template for subsequent epitaxial growth of doped GaN layers to make LED devices with unconventional topologies. The general method of fabrication uses a technique such as plasma etch or laser ablation to form a damage region in the GaN layer, followed by a wet etch that selectively removes the damaged material. The final shape is formed by crystallographic planes of GaN that have very low etch rates and have desirable properties for device fabrication such as low density of dislocations and trap states. One aspect of the first etch step is to remove material and create a damage profile with a shape such as a micro-rod or conical cavity that is appropriate for the type of device to be made. Other techniques such as ion implant or sand blasting may also be used to form the damage region. The wet etch step refines the initial shape and produces surfaces with low damage that can make high quality devices.

One aspect forms columnar templates and deposits the layers required to make an LED over the template to make micro-rod LEDs that can be harvested, deposited on a new substrate, and wired together to make an array of LED emitters.

One other consideration of the planar LED structure is the high index of refraction of GaN, which limits the amount of light that can be emitted to a narrow angular cone. Light outside the escape cone is reflected internally, diminishing the efficiency of the device. As noted above, a variety of ways have been devised to enhance the roughness of the encapsulation layer of conventional planar devices as a means to allow more light to escape. The structures disclosed herein improve light extraction by etching a surface texture in the n-type GaN starting material before LED fabrication, which also increases the emission area compared to a conventional planar LED.

To fabricate high performance of GaN based devices, GaN patterning (i.e. etching) techniques are crucial. Variations in the quality of the as-grown GaN, coupled with the high bond energies associated with "III-nitride" materials, present unique challenges for etching processes. Similar to etching other semiconductor materials, plasma based dry etch and chemical based wet etch are the two major etch techniques for GaN patterning. Laser patterning GaN film is also capable of achieving unique structures when combined with proper wet etching techniques to remove the ablated material and the thermal decomposition.

Typical etching gases for GaN plasma dry etch are $Cl_2$/Ar. Argon (or helium) is added to stabilize the plasma or for cooling purposes. Argon addition causes inert ion bombardment of the surface, which results in enhanced anisotropic etching, while the chlorine-based plasma produces (volatile) chemical byproducts such as $GaCl_3$. The dry etch process can achieve a highly anisotropic etch with a high etching rate and has a smooth surface morphology. Using $Cl_2$-based plasma to etch GaN is desirable because chlorine-based gas chemistry is widely used in the processing of semiconductor devices.

Figure 7:
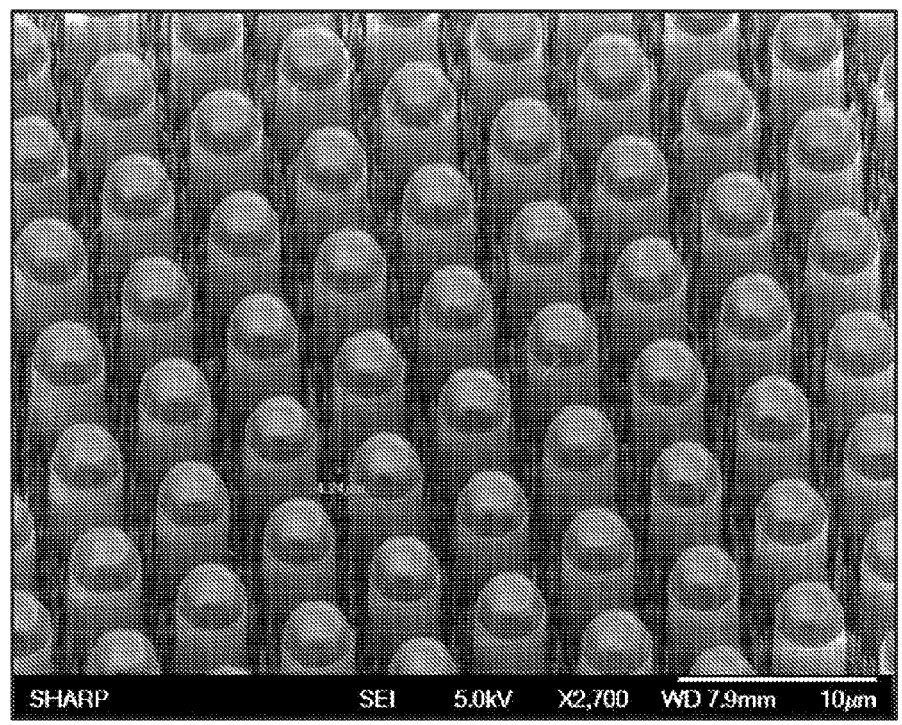
FIG. 7 is a perspective view showing a GaN micro-pillar array etched using $Cl_2$-based plasma dry etch.

FIG. 7 is a perspective view showing a GaN micro-pillar array etched using $Cl_2$-based plasma dry etch. The etch parameters may be controlled. Defects in the GaN appear to be particularly sensitive to etching conditions and respond by etching faster or slower than the surrounding material, ultimately forming pits or grass, as shown.

One facet of GaN plasma dry etching is that it is easy to generate ion-induce damages, which may degrade the GaN based devices performance. To address this issue, the dry and wet etching techniques may be combined, or laser ablation and wet etching techniques may be combined.

As mentioned above, most conventional processes deposit GaN on foreign substrates, such as sapphire or silicon carbide. Wet etching studies have previously been limited almost exclusively to the (0001) orientation, since until recently, only such epitaxial films were available. A variety of chemistries have been demonstrated as being able to attack specific planes in the GaN crystallographic system, as shown in Table 1.

TABLE 1

Etch rates and observed etching planes for various chemicals.

| Chemical | Temperature (° C.) | Etch rate (μm/min) | Etching planes observed |
| --- | --- | --- | --- |
| Acetic acid ($CH_3COOH$) | 30 | <0.001 | None |
| Hydrochloric acid (HCl) | 50 | <0.001 | None |
| Nitric acid ($HNO_3$) | 81 | <0.001 | None |
| Phosphoric acid ($H_3PO_4$) | 108-195 | 0.013-3.2 | $\{10\bar{1}2\}, \{10\bar{1}3\}$ |
| Sulphuric acid ($H_2SO_4$) | 93 | <0.001 | None |

TABLE 1-continued

Etch rates and observed etching planes for various chemicals.

| Chemical | Temperature (° C.) | Etch rate (μm/min) | Etching planes observed |
|---|---|---|---|
| Potassium hydroxide (KOH), molten | 150-247 | 0.003-2.3 | {10$\bar{1}$0}, {10$\bar{1}$1} |
| 50% KOH in H$_2$O | 83 | <0.001 | None |
| 10%-50% KOH in ethylene glycol (CH$_2$OHCH$_2$OH) | 90-182 | 0.0015-1.3 | {10$\bar{1}$0} |
| 50% NaOH in H$_2$O | 100 | <0.001 | None |
| 20% NaOH in ethylene glycol | 178 | 0.67-1.0 | None |

GaN can be etched in an aqueous base solution, however, etching ceases upon the formation of an insoluble coating of presumably gallium hydroxide (Ga(OH)$_3$). For (0001) orientation GaN films, there are two types surfaces polarity, one is Ga-polar GaN and another is N-polar GaN. Most GaN films grown by metal organic chemical vapor deposition (MOCVD) or hydride vapor phase epitaxy (HVPE) are Ga-polar films, and GaN films grown by metal organic molecular beam epitaxy (MOMBE) are N-polar films. As noted in "Crystallographic wet chemical etching of GaN" APL v. 73. n. 18, 1998, p. 2655, in aqueous KOH, NaOH or TMAH, only nitrogen polar GaN films were etched, and produced triangular shaped pyramids limited by (11$\bar{2}$1) planes. No etching of Ga-polar films occurred in aqueous KOH, NaOH or TMAH.

The different etching characteristics of Ga-polar and N-polar crystals are due to the different states of surface bonding and are only dependent on polarities. The mechanism of such polarity selective etching was interpreted by D. Li, M. Sumiya, K. Yoshimura, Y. Suzuki, Y. Fukuda, S. Fuke, Phys. Status Solidi A 180 (2000) 357.

Figure 8:
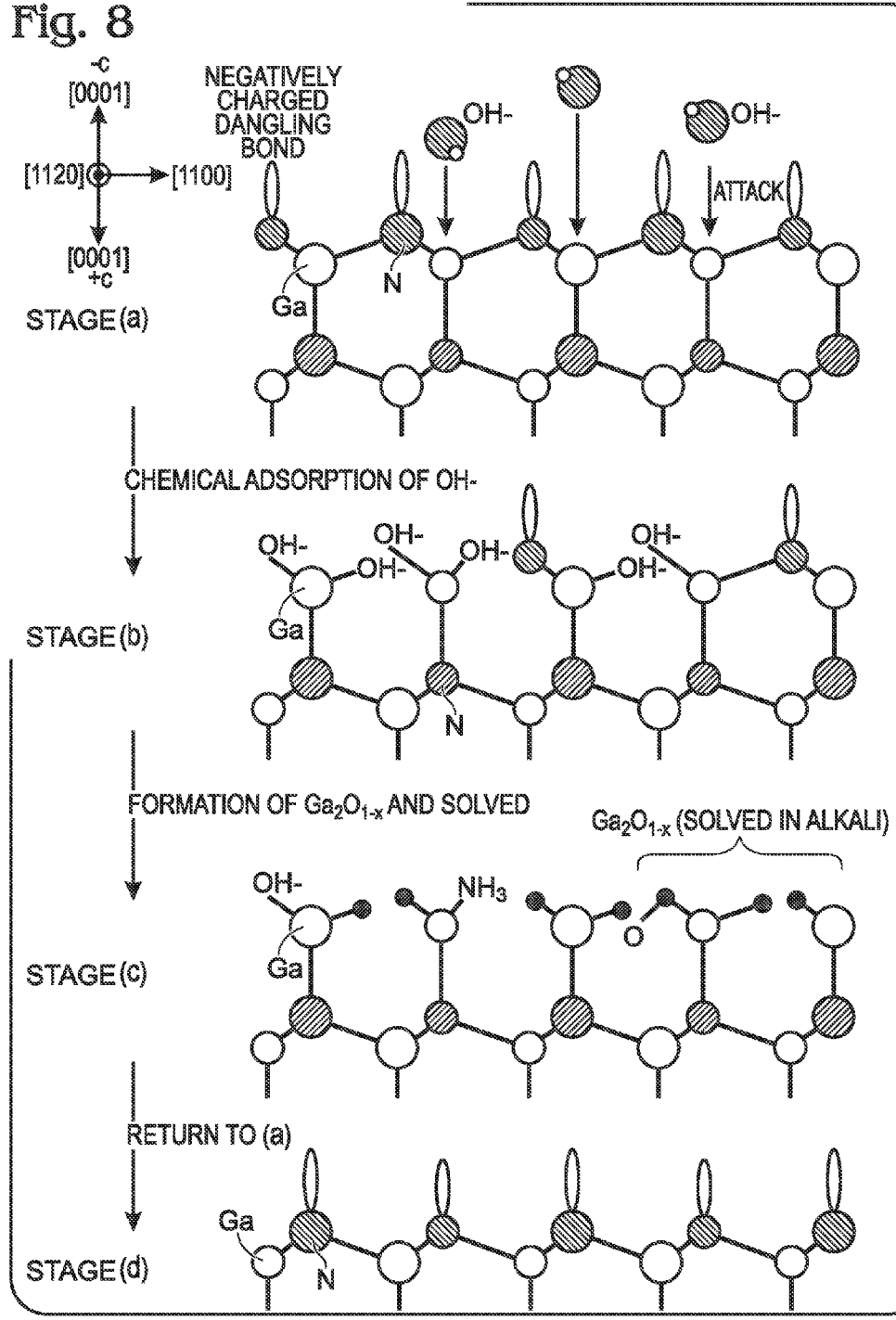
FIG. 8 depicts schematic diagrams of the cross-sectional GaN film viewed along the direction for N-polar GaN to explain the mechanism of the polarity selective etching.

FIG. 8 depicts schematic diagrams of the cross-sectional GaN film viewed along the direction for N-polar GaN to explain the mechanism of the polarity selective etching. Stage (a) shows a nitrogen terminated layer with one negatively charged dangling bond on each nitrogen atom. Stage (b) depicts the adsorption of hydroxide ions. Stage (c) shows the formation of oxides. Stage (d) depicts dissolving of the oxides.

The hydroxide ions (OH—) are first adsorbed on the sample surface and subsequently react with Ga atoms following the reaction:

$$2GaN + 3H_2O \xrightarrow{KOH} Ga_2O_3 + 2NH_3$$

KOH works as a catalyst and is also a solvent for the resulting Ga$_2$O$_3$ (Step (d)). As the stages of (a) to (d) in FIG. 8 repeat, the N-polar GaN can be etched. Note that it does not matter which atoms form the surface termination layer. If the surface is Ga-terminated, the etching can be initialized by Stage (c). In contrast, the inertness of Ga-polar GaN is ascribed to the repulsion between (OH—) and three occupied dangling bonds of nitrogen, which prevents the hydroxide ions from attacking the Ga atoms, so that the Ga-polar GaN films are not etched.

However, the large lattice mismatch between the epitaxy layer and substrate results in a high dislocation density in GaN, typically in the range of $10^7$-$10^{11}$ cm$^2$. Such defects have a pronounced effect on the etching rate and the resulting surface morphology.

Figure 9:
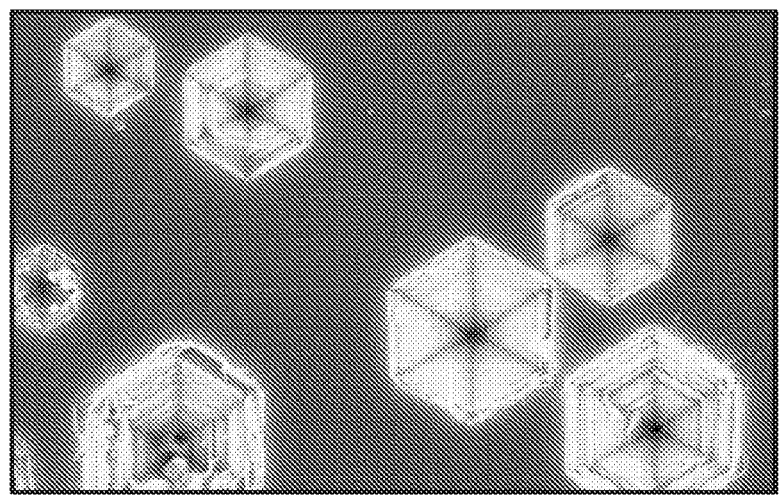
FIG. 9 depicts hexagonal-shaped etch pits due to the selective attack of the etchant on the dislocation defects spots.

FIG. 9 depicts hexagonal-shaped etch pits due to the selective attack of the etchant on the dislocation defects spots. As noted by Seok-In Na et al., "Selective Wet Etching of p-GaN for Efficient GaN-Based Light-Emitting Diodes", IEEE Photonics Technology Letters, Vol. 18, No. 14, Jul. 15, 2006, not only can the dislocation-related selective etch happen in the base etchant, defects introduced by plasma dry etch can also initiate the same kind of selective etch, as shown.

Figure 10A:
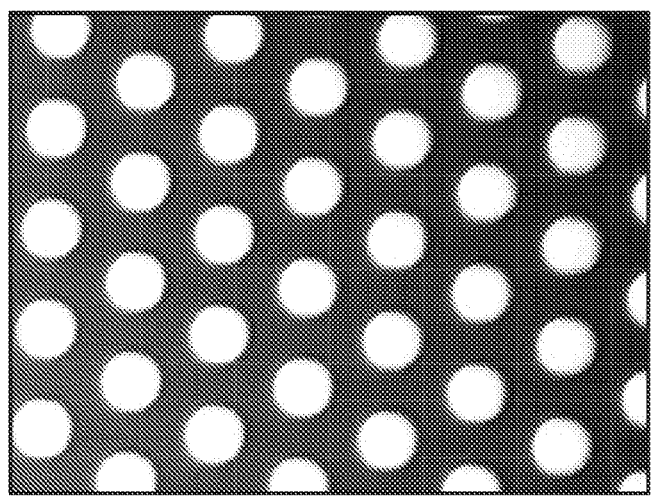
FIGS. 10A through 10C depict selective GaN etches with defects introduced by a plasma dry etch in TMAH etchant.
Figure 10B:
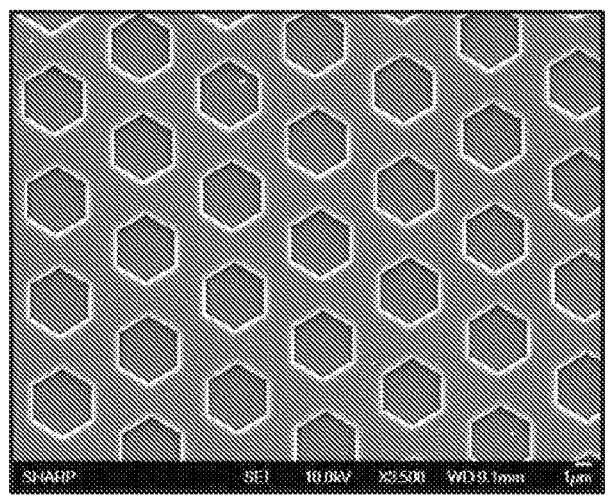
Figure 10C:
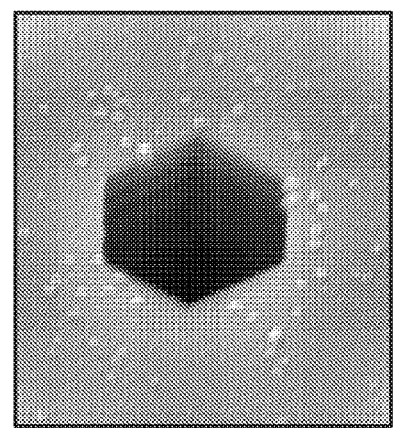

FIGS. 10A through 10C depict selective GaN etches with defects introduced by a plasma dry etch in TMAH etchant. FIG. 10A shows the GaN surface after a 1-minute plasma etch. FIG. 10B shows the same surface after a TMAH wet etch. FIG. 10C is a close-up view of a hexagonal pit. Thus, the etching is done in two steps: first a circular cavity is plasma dry etched into the (0001) planes (FIG. 10A), then crystallographic etch delineates the slow etch rate planes (FIG. 10B). In this case, the plane families (10$\bar{1}$0) are perpendicular to the c-plane in which the hexagonal pits are formed. The (10$\bar{1}$0) plane families can not only form the inner sidewalls of hexagonal pits, they can also be the sidewall of triangle shape GaN micro posts outer sidewall, as shown in FIG. 11.

Figure 11:
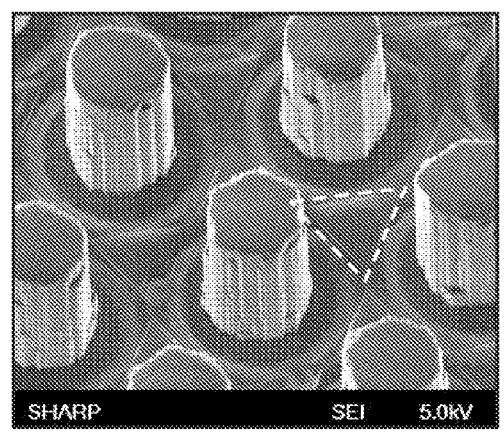
FIG. 11 depicts hexagonal-shaped GaN micro posts, which are a byproduct of a circular micro post etch.

FIG. 11 depicts hexagonal-shaped GaN micro posts, which are a byproduct of a circular micro post etch. Clearly, the complementary mask for dry etching micro posts in FIG. 11, followed by the TMAH crystallographic etch, yields full height hexagonal-shaped GaN micro posts or pillars. There are many advantages to fabricating hexagonal-shaped GaN micro posts, as discussed below. It should be understood that the introduction of the initial defects need not be limited to a plasma dry etch. The laser ablation of GaN followed by crystallographic etch in TMAH creates a similar result. Other techniques used to generate damage regions in a regular pattern such as ion implantation may also work.

For controlled defects generation by laser ablation, the planar GaN film is subjected to pulsed excimer laser irradiation in order to induce thermal decomposition of the GaN into metallic gallium and nitrogen. The noncoherent nature of the excimer laser permits the irradiation of multiple regions simultaneously, although coherent light sources may also be used with diffractive optics.

One pattern consists of a hexagonal array of dots that effectively drills holes into the GaN film to a predetermined penetration depth. This depth is controllable by the number of pulses that are allowed to impinge on a given area and by the energy density of the laser pulse. This laser drilling induces defects in the sidewalls of the affected region which can be subsequently etched anisotropically with a wet etch such as heated dilute TMAH (tetramethyl ammonium hydroxide). This anisotropic etch removes the defective material and effectively stops on the c-plane and m-planes in the film, resulting in a hexagonal etch pit that extends from the GaN film surface to the laser penetration depth. By manipulating the angular orientation of the hexagonal dot array that is used for irradiating the surface with the crystallographic orientation of the GaN film, a predetermined pattern can be formed in the final laser-drilled and wet-etched GaN. For example, if the laser array is aligned to the m-plane orientation, the laser-drilled pits can be etched to end up with a honeycomb structure, as the slowest-etched facets are perpendicular to the nearest neighbor pit. Conversely, when the laser array is aligned to the a-plane orientation (i.e., rotated from the first orientation by 30°), the corners of the etched hexagonal pits impinge upon those from their nearest neighbors, and triangular structures can form if the wet etch process proceeds for a sufficient amount of time.

Figure 12A:
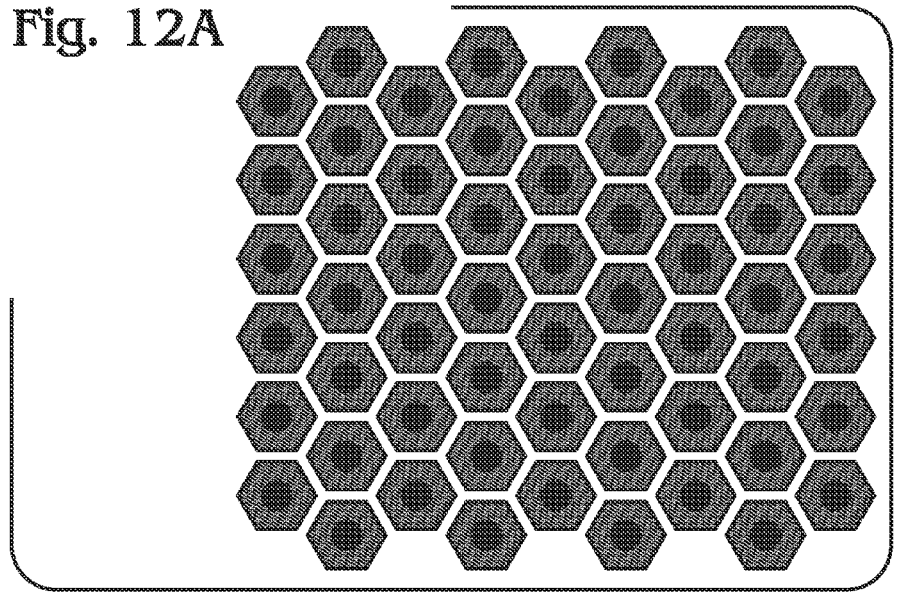
FIGS. 12A and 12B depict possible etch configurations for the combined laser drilling plus anisotropic wet etch process.
Figure 12B:
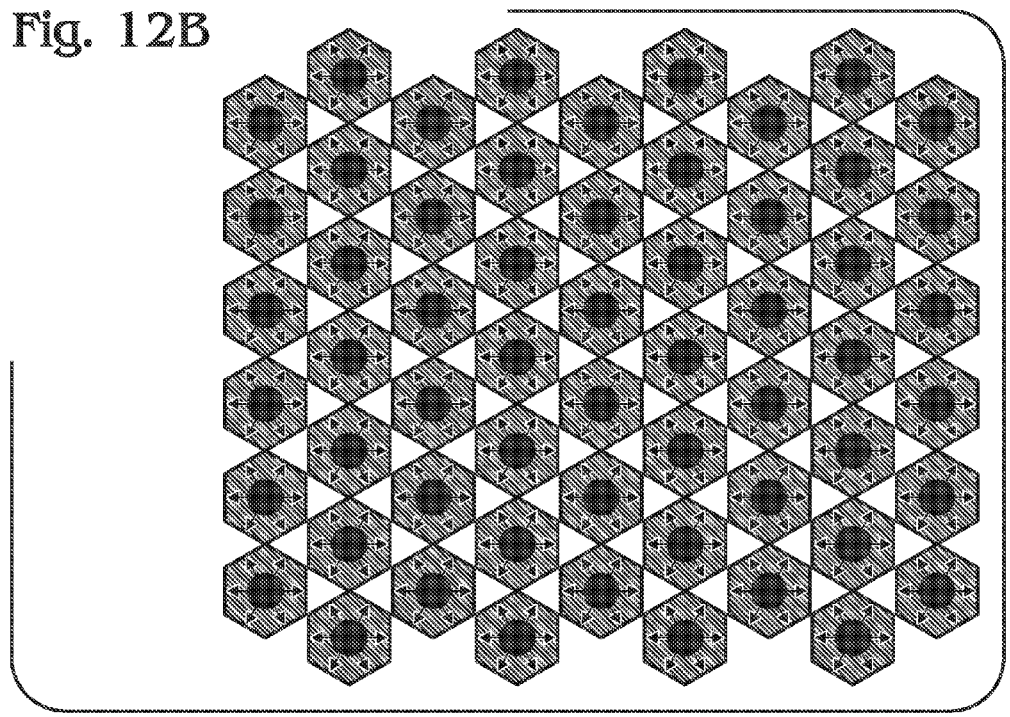

FIGS. 12A and 12B depict possible etch configurations for the combined laser drilling plus anisotropic wet etch process.

The laser pattern in FIG. 12A is aligned to the m-plane GaN orientations, while the laser pattern in FIG. 12B is aligned to the a-plane GaN orientation. The black areas represent the initial laser drilling hole, while the gray areas represent the GaN removed by the anisotropic wet etch.

The first of the two configurations (FIG. 12A) results in a well-ordered array of etched pits that have only the c-planes and nm-planes exposed. This increase in surface area can be exploited for planar LED applications, allowing epitaxial growth of GaInN and p-GaN over the best-suited crystallographic planes. Due to the nature of the laser process, the depth and sidewall slope of the etched pits can be precisely controlled by the laser fluence and shot count. A typical example for forming etch pits in the GaN would involve 100 shots per area with a 308 nm laser fluence of 1.7 J/cm$^2$. This is then etched in a piranha bath ($H_2O_2$ and $H_2SO_4$ at 140° C. for 20 minutes) to remove the ejected Ga metal, and then etched for 4 to 120 hours in 75° C. TMAH (5%).

The second of the two configurations (FIG. 12B) is well-suited for forming etched vertical μ-rods or pillars. Carrying out the anisotropic etch until the corners of the hexagonal pits impinge upon one another allows the bulk of the GaN material to be removed, leaving only triangular vertical pillars. The anisotropic etch leaves behind the m-planes (the family of (1$\bar{1}$00) planes in the wurtzite structure, unless they are the a-planes, which are (1$\bar{1}$20) families), yielding a triangular pillar with all faces in the same family of planes. The m-planes are non-polar, making them more favorable for LED device applications.

Experiments show that there is a sharp threshold fluence at approximately 1,100 mJ/cm$^2$ for the laser process to induce thermal decomposition of the GaN films, that is independent of the number of pulses irradiated onto a specific area. The uniformity of laser-induced damage at or close to this threshold is poor due to the stochastic nature of the thermal decomposition and variations in the spatial profile of the laser pulse. However, at higher fluences where thermal decomposition is more readily and uniformly achieved, the number of laser pulses can be seen to have a secondary effect on the sidewall profile and depth of the damaged region in the GaN film. This is particularly noteworthy where a lower shot count (i.e., 30 shots per area) results in shallower etch depth with a more pronounced tapering in towards the center of the etched pit. At higher shot counts per area, the sidewall profile is steeper, and there is less tapering in towards the center with increasing penetration. This is a result of the more numerous laser pulses being responsible for ejecting the molten metallic gallium away from the drilled hole, thereby allowing the thermal decomposition of material at the bottom of the laser-drilled hole to extend laterally from the center.

Experiments were also conducted to observe the effect of anisotropic etching in 5% TMAH at 85° C. for 138 hours following damage inducement by laser drilling. The laser drilling causes extensive damage to the GaN film through the thermal decomposition of the GaN, as well as by the appearance of steep thermal gradients in the localized region surrounding the laser-drilled holes. This damaged material is anisotropically etched by the heated dilute TMAH, which readily attacks the damaged GaN, but is slowed by certain crystallographic places, such as the c-planes and m-planes. This ability to control the profile of the damaged region relative to the crystallographic layout of the GaN film, either by dry etching or by laser drilling, permits control over the final shape of the 3D template being produced.

The laser drilling process is an effective means of inducing damage in the GaN film, especially with a projection-based, excimer-laser-based processing tool. The projection system coupled with a high-power excimer laser allows for a large region to be exposed simultaneously with a uniform fluence that is sufficient to cause thermal decomposition of the GaN. This type of system also has a wide depth of field, typically greater than 25 μm, which eliminates the problems encountered with substrate bowing due to the CTE mismatch during growth of the GaN. The bowing of the substrates is approximately 7-10 μm, which is difficult to overcome with photolithography as used for dry etching of the GaN to form the etched pits prior to etching in TMAH. Excimer lasers are pulsed laser systems that can operate at relatively high frequencies (typically 300 Hz, although some laser systems can go up to 4 kHz), allowing high throughput processing of GaN on sapphire substrates.

Figure 13A:
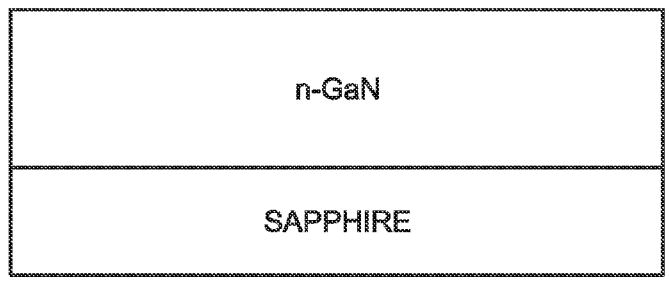
FIGS. 13A through 13G depict steps in an exemplary process fabricating a planar honeycomb LED structure enhanced by three dimensional texturing.
Figure 13B:
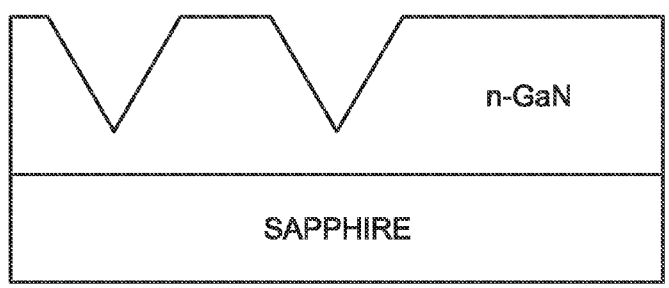
Figure 13C:
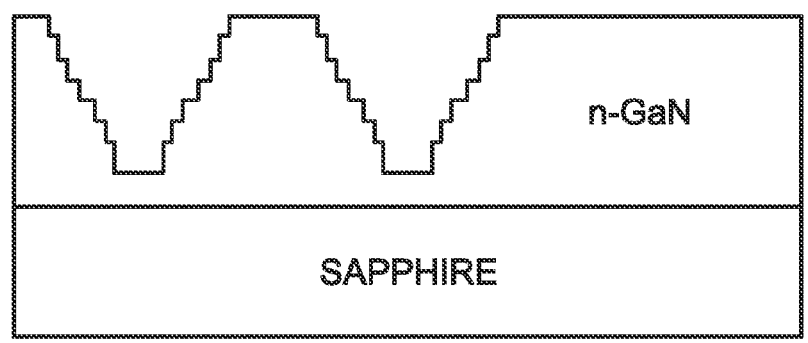
Figure 13D:
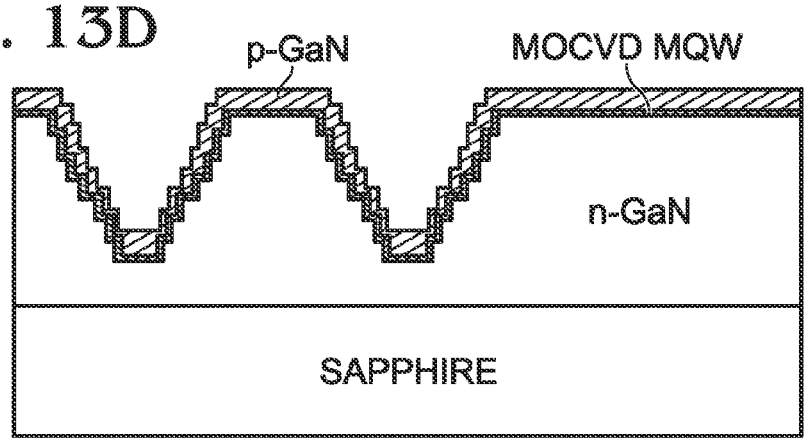
Figure 13E:
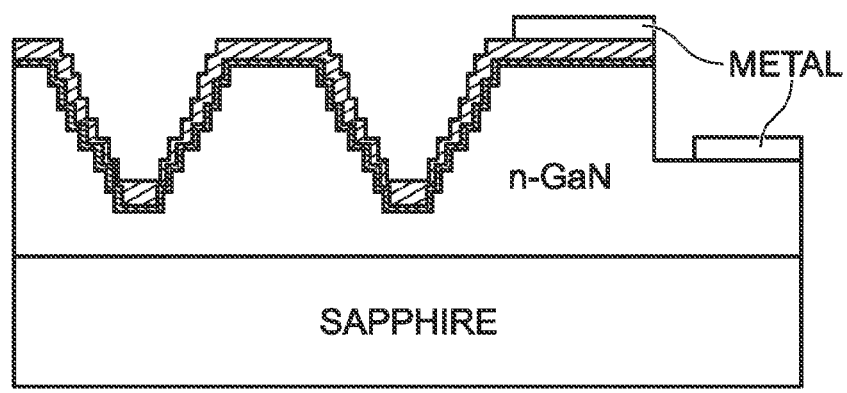
Figure 13F:
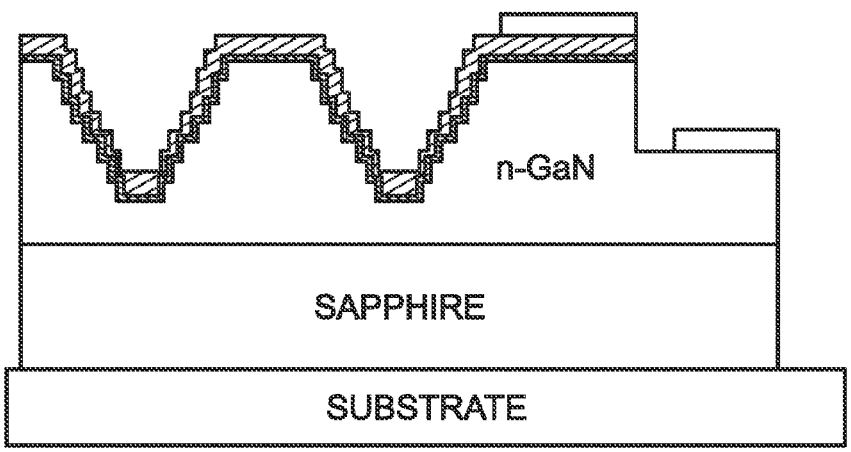
Figure 13G:
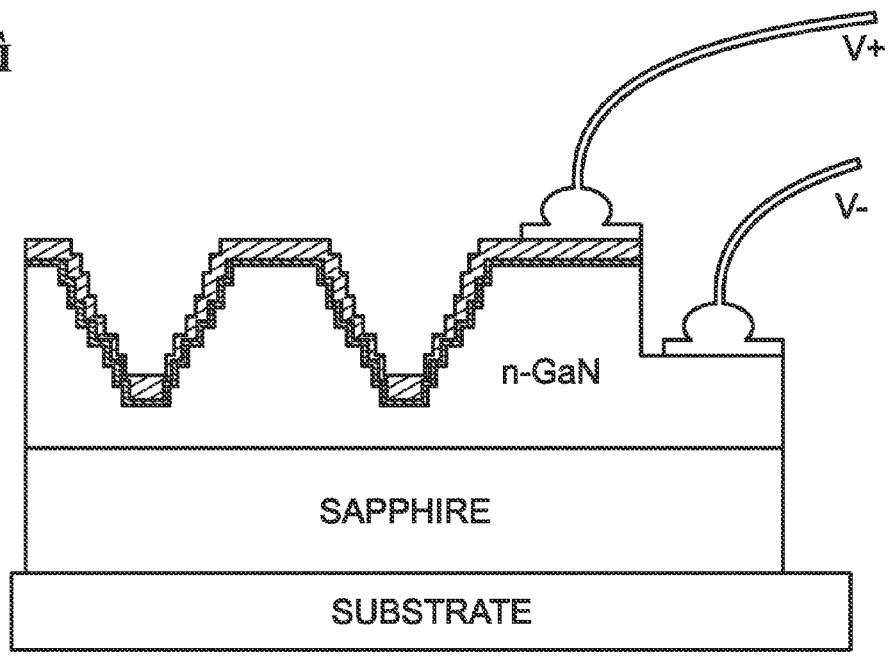

FIGS. 13A through 13G depict steps in an exemplary process fabricating a planar honeycomb LED structure enhanced by three dimensional texturing. FIG. 13A begins with a sapphire substrate and grows a thick n-GaN layer using a MOCVD or MBE process. In FIG. 13B, deep cone-shaped pits are etched or ablated in the n-GaN. In FIG. 13C a wet etch is used, as described above, to remove the damaged GaN. In FIG. 13D a thin n-GaN layer may optionally deposited. Then, the MQW and p-GAN layers are deposited to form an LED on the n-GaN template. In FIG. 13E an opening is etched to contact the n-GaN. A metal is deposited on p-GaN and n-GaN contacts using appropriate metal appropriate to prevent a Schottky barrier. In FIG. 13F the sapphire wafer is sawed to singulate devices and an array of devices is attached to a substrate. In FIG. 13G connections are made to the LED with wire bonding. In one aspect, a thin layer of Ni is conformally deposited to make ohmic contact with the p-GaN layer, and a transparent conductor such as ITO, ZnO, carbon nanotubes (CNTs), or graphene is conformally deposited as a current spreading layer, prior to forming the metal contact.

Figure 14A:
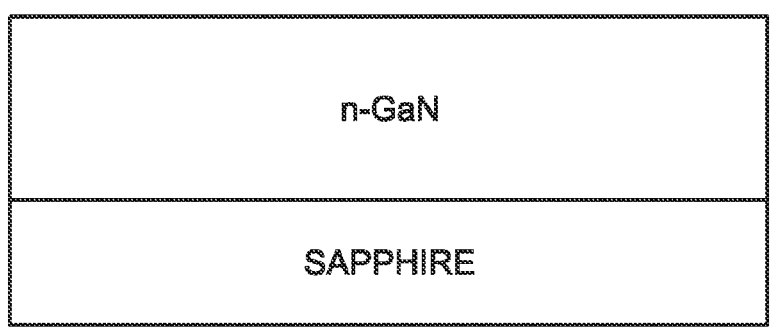
FIGS. 14A through 14O depict steps in an exemplary process for fabricating a micro-rod or pillar LED device.
Figure 14B:
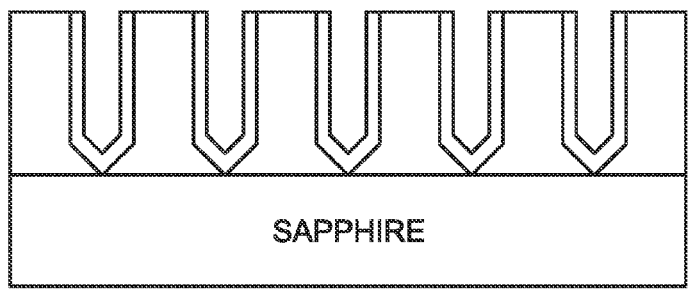
Figure 14C:
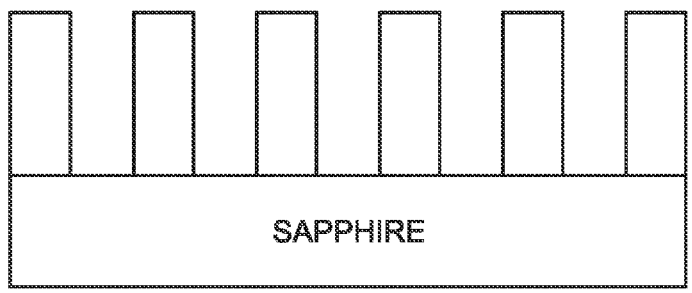
Figure 14D:
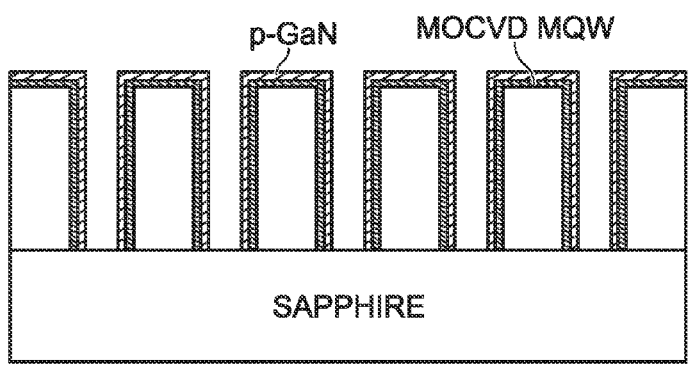
Figure 14E:
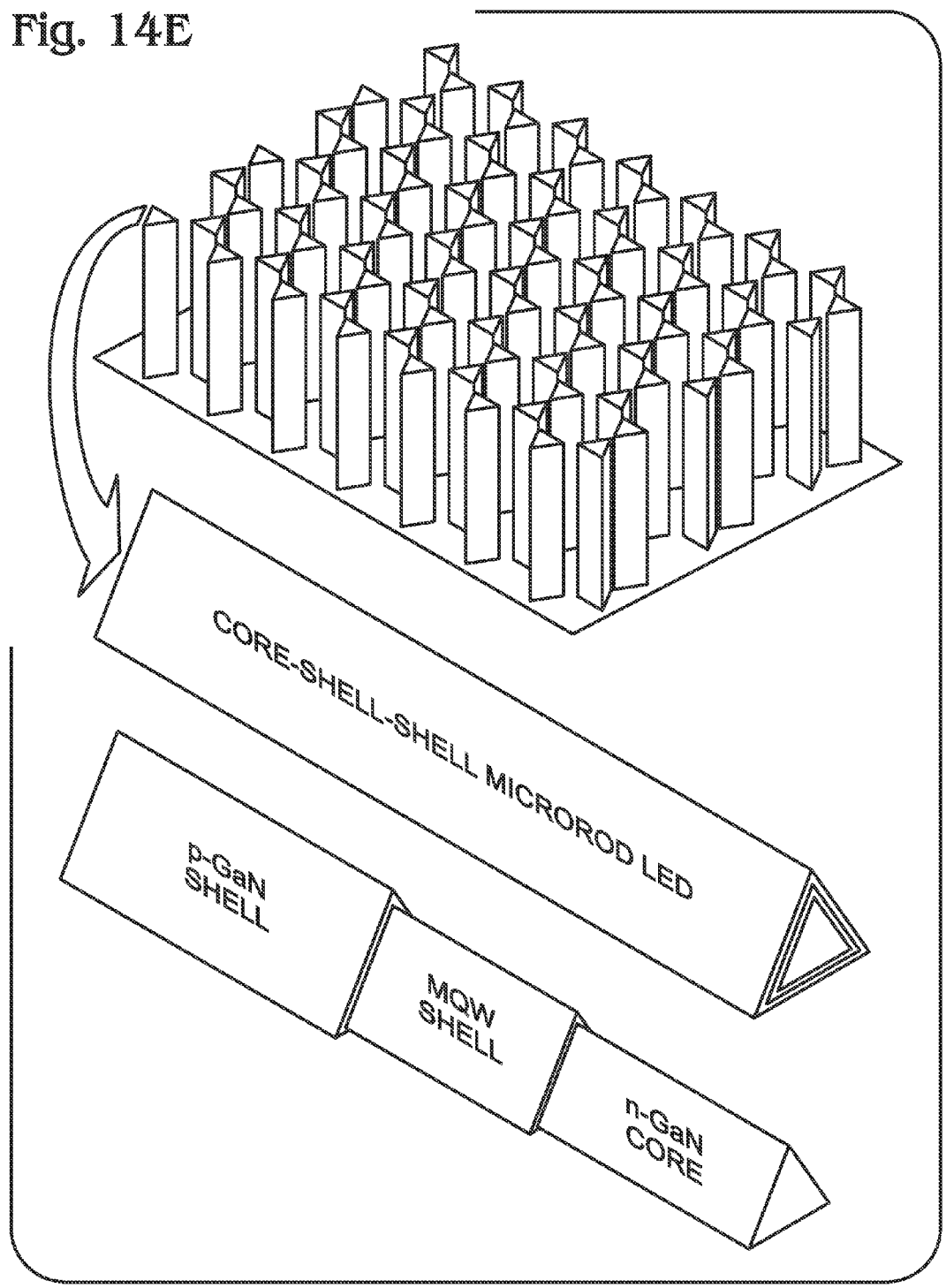
Figure 14F:
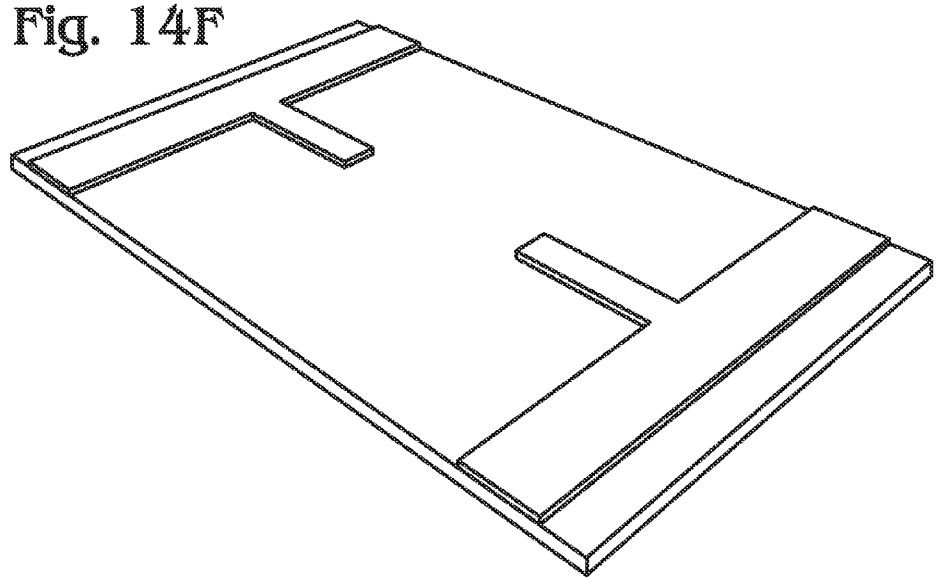
Figure 14G:
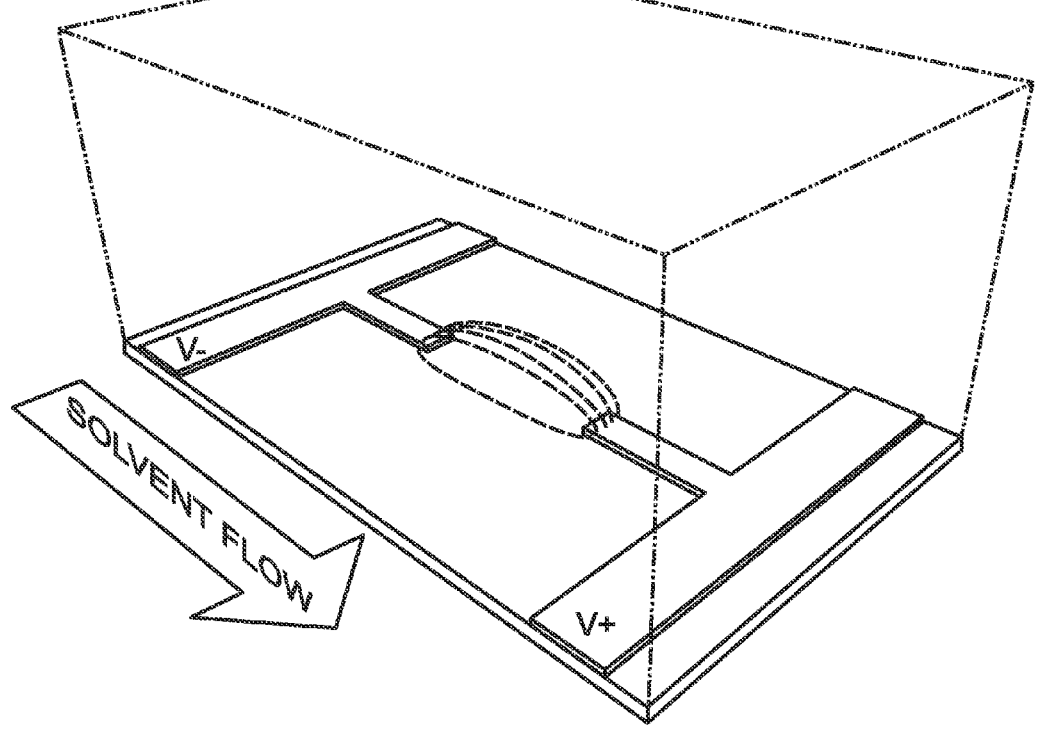
Figure 14H:
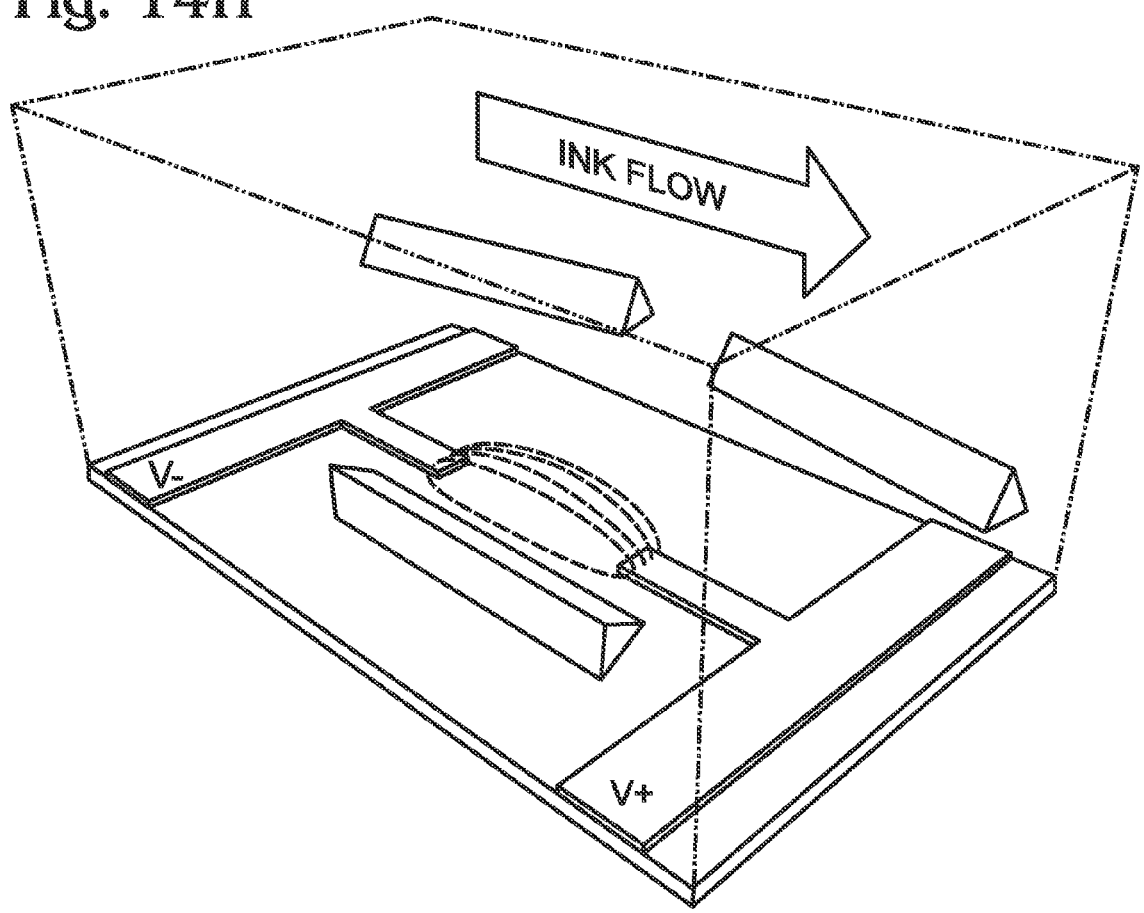
Figure 14J:
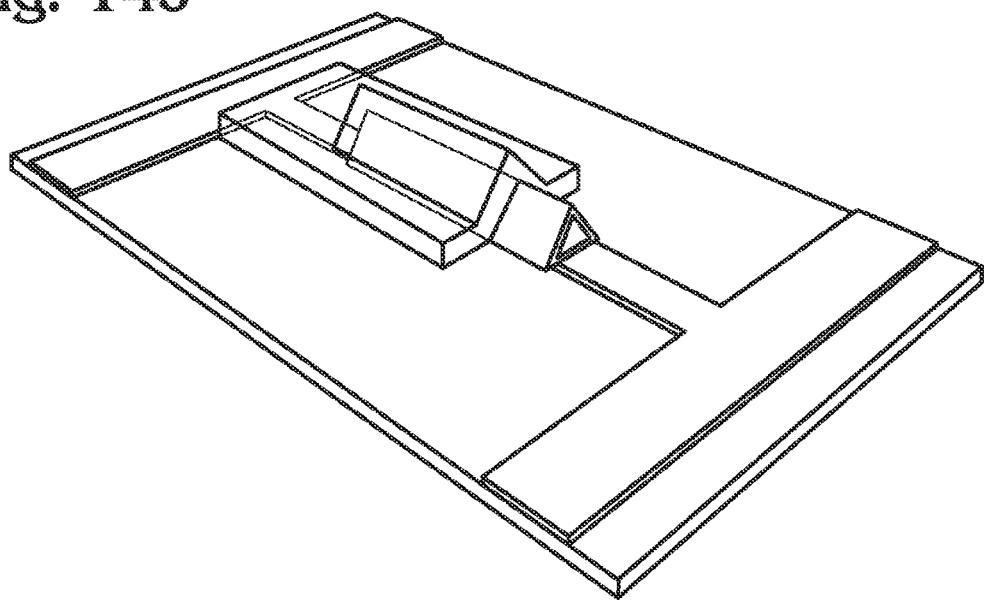
Figure 14K:
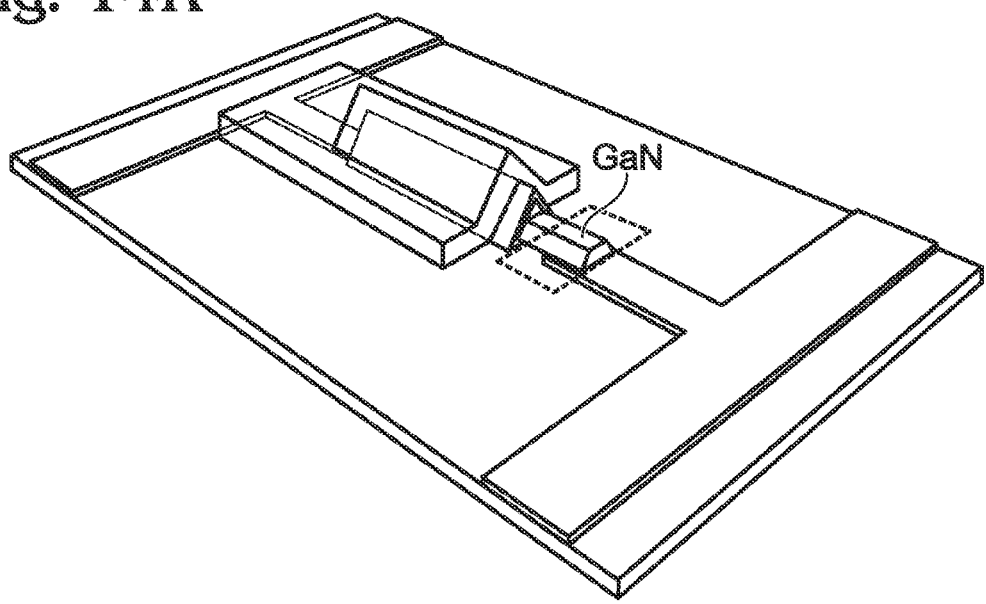
Figure 14L:
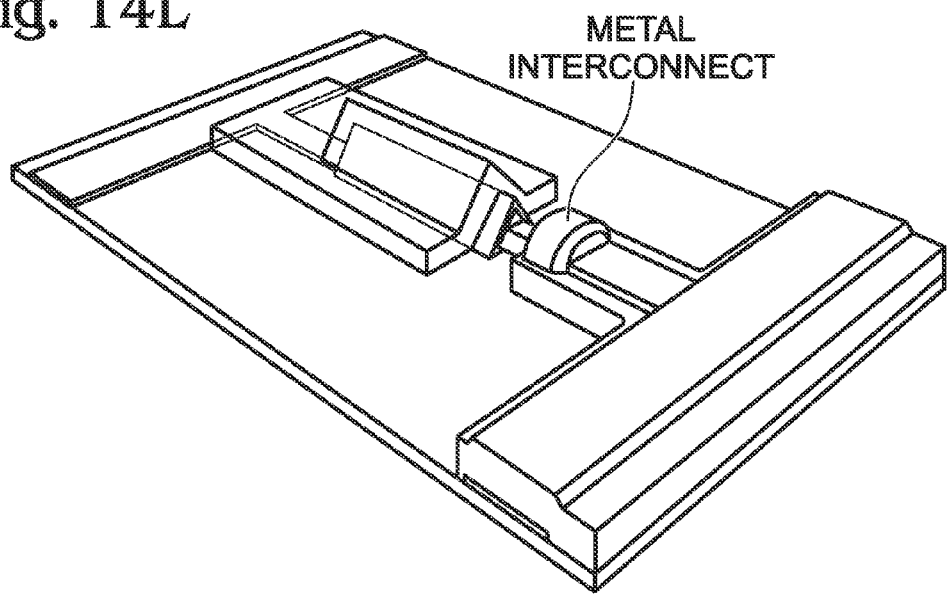
Figure 14M:
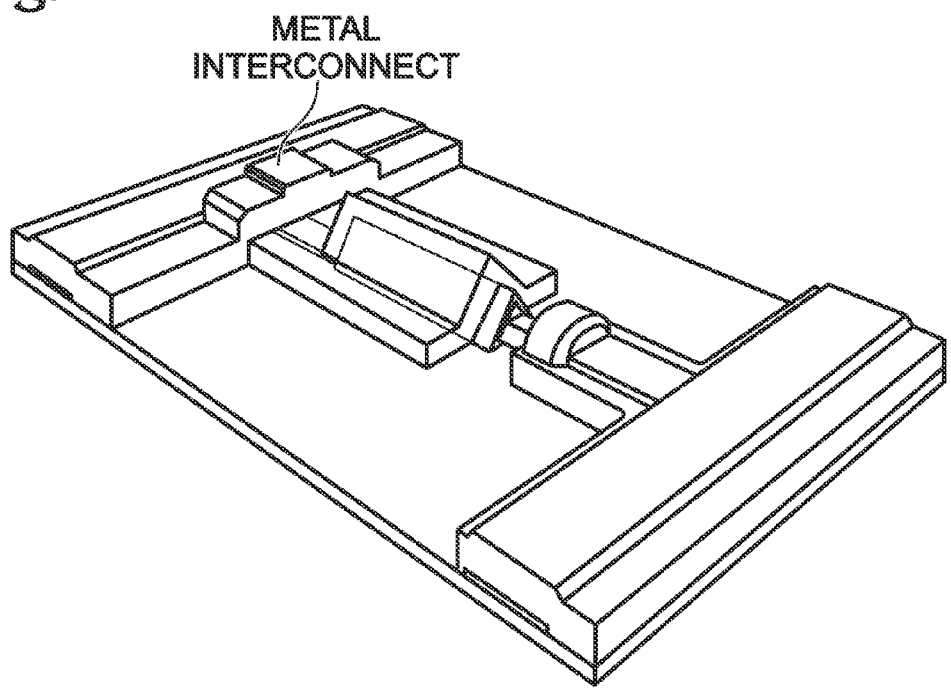
Figure 14O:
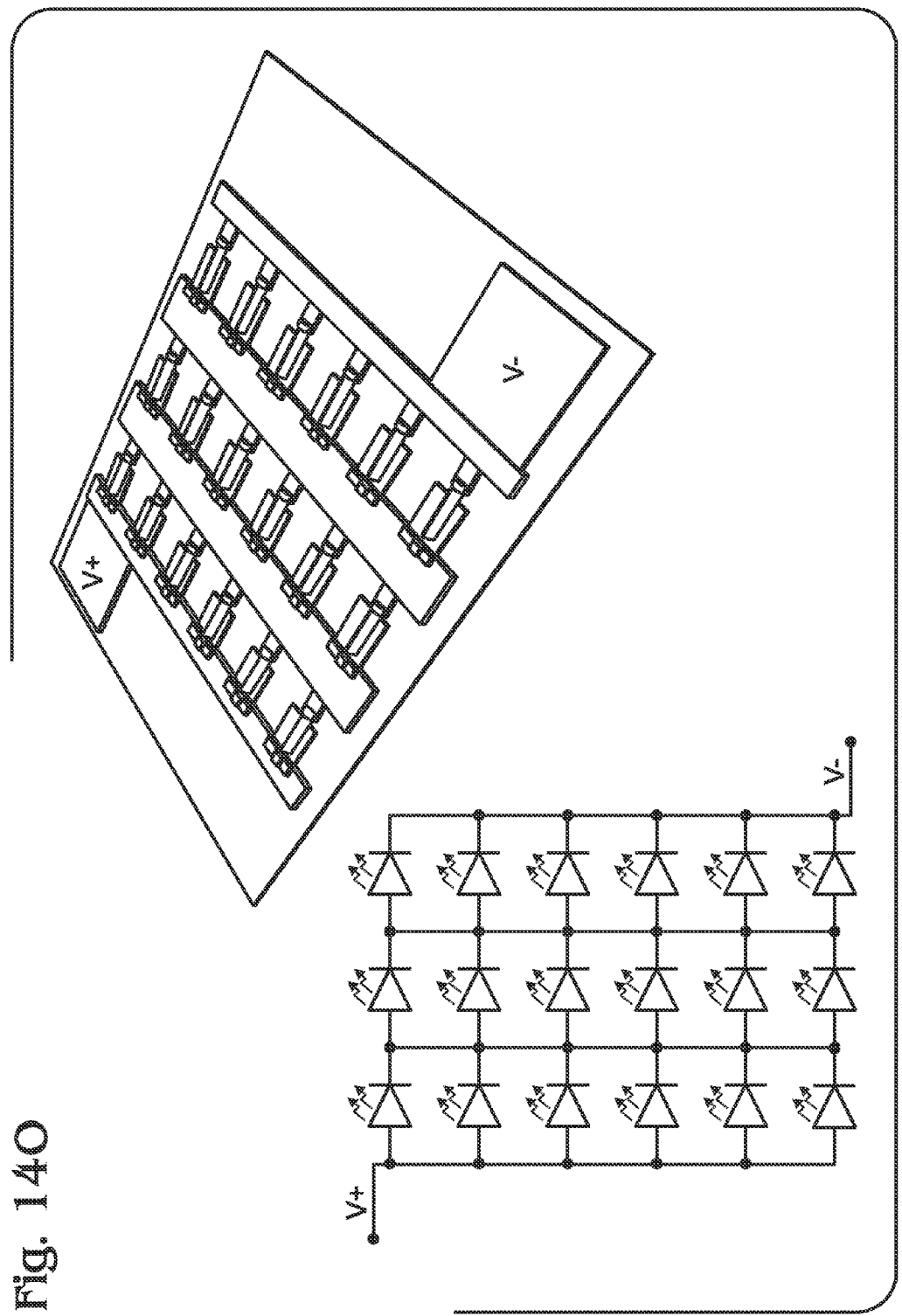

FIGS. 14A through 14O depict steps in an exemplary process for fabricating a micro-rod or pillar LED device. FIG. 14A begins with a sapphire substrate and an n-GaN layer is grown by MOCVD or MBE, typically 10 to 30 microns (um) thick. In FIG. 14B the n-GaN is etched or ablated to form either triangular or hexagonal pillars. In FIG. 14C a wet etch is used, as described above, to remove the damaged GaN forming vertical pillars. In FIG. 14D a thin n-GaN layer is optionally formed. MQW and p-GAN layers are deposited to form an LED on the n-GaN template. The MQW layer is a series of quantum well shells (typically 5 layers—alternating 5 nm of InGaN with 9 nm of n-GaN. There may also be an AlGaN electron blocking layer (not shown) between MQW layers and p-GaN. The outer shell is p-doped GaN (Mg doping) about 200 nm thick. A high-brightness blue LED can be formed, or a green LED if a higher indium content is used in the MQW. In FIG. 14E the micro-rods (pillars) are harvested from the sapphire wafer using laser lift-off. For example, the substrate and n-GaN layer may be attached to a Si handling wafer using a thermoplastic polymer. In one aspect the pillars are detached using a 1-shot XeCl laser (λ=304 nm) at 1100 mJ/cm$^2$. After detachment, the thermoplastic polymer can be dissolved in acetone to separate the handling wafer.

In summary, the above-described fabrication processes are a combination of a damage-inducing etch of GaN films, with an anisotropic crystallographic wet etch, to produce predetermined 3D structures. Using these methods, etch pits in GaN can form an array of hexagonal tapered pits bounded by the crystallographic m and c planes. Triangular, vertical GaN μ-rods with m-family {1$\bar{1}$00} sidewalls can be made that are ideal (i.e., non-polar) templates for LED applications. Hexagonal, vertical GaN μ-rods with a-family {11$\bar{2}$0} sidewalls can be made that are ideal (i.e., non-polar) templates for LED applications.

In FIG. 14E the LED structure fabrication begins with a planar substrate that can be glass or plastic. For example, a Gen 6 LCD glass substrate (1500×1850 mm) can be used. A metal layer is deposited, such as Ta or Al for example, and patterned to make e-field electrodes. Positive and negative bus lines connect multiple pairs of e-field fingers. Fingers (digits) are positioned where GaN pillar structures are to be deposited. Typically, the space between fingers is less than the pillar structure length.

In FIG. 14F a suitable solvent (e.g., isopropyl alcohol, water, or acetone) is flowed over the substrate surface. A modulated AC field is applied to the e-field structure to produce a capture field between the fingers.

In FIG. 14G, after the surface is completely wetted, ink with suspended GaN pillar structures is injected. The ink flow and field are adjusted to capture pillar structures between e-field electrode fingers. At a high flow and low field, GaN pillar structures are not captured. At low flow and high field strength, multiple GaN pillar structures may be captured. When the flow and field are balanced, only one GaN pillar structure is captured per position, which is the objective.

In FIG. 14H, when there are GaN pillars captured at each position, the field is increased to pin the GaN pillars to the substrate. Solvent is flowed instead of ink, and the flow rate is increased to flush out excess non-captured GaN pillar structures, leaving one GaN pillar structure centered at each position.

In FIG. 14I, when the solvent has dried, the structure is ready for device fabrication. Because the p-GaN layer has very low conductivity, a current spreading layer may be used. A very thin layer of Ni (typically 2 nm thick) is conformally deposited to make ohmic contact with the outer p-GaN shell layer. A transparent conductor such as ITO, ZnO, carbon nanotubes (CNTs), or graphene is conformally deposited as a current spreading layer.

In FIG. 14IJ the current spreading layer is patterned and etched, leaving room on one end of the wire to make contact to the n-GaN pillar. A wet etch may be used to pattern most conductive transparent oxides. An oxygen plasma etch may be used for CNT or graphene.

In FIG. 14K, one end of the GaN pillar structure is patterned and etched to make electrical contact with the n-GaN pillar core. Using a $Cl_2$ based reactive ion etch (RIE), the p-GaN shell and the multiple quantum well layers can be removed to reveal the n-GaN core. As shown, there may be some over-etch into the core.

In FIG. 14L a metal interconnect is deposited to contact the n-GaN pillar core and make the negative voltage bus lines. The metal may, for example, be Au or Al with a Ti interface layer to make ohmic contact with n-GaN.

In FIG. 14M a metal interconnect is deposited to contact the current spreading layer. The metal may be Au or Al with a Ni interface layer. Alternatively, this metal could be deposited first and the n-GaN metal deposited over it. As another alternative, metal can also be deposited for both n-GaN and current spreading layer in the same step.

FIG. 14N depicts a single cell with parallel connected GaN pillar structures. The cell is conceptually simple. The amount of light produced is proportional to the number of GaN pillar structures. For example, an operating of about 3.4 V may be used.

FIG. 14O depicts a cell with series-parallel connections with three diode strings in series, which may use an operating voltage up to about 10 V. A more practical product is likely to be bigger with parallel-series connections having hundreds or thousands of GaN pillar structures, depending on the requirements.

FIGS. 16A and 16B are scanning electron microscope (SEM) image representations of, respectively, a honeycomb structure and triangular etched pillars. Both samples were processed with 120 laser shots per area at 1.6 $J/cm^2$. The substrate flat orientation is typically aligned to either a-axis or m-axis. A 30° offset (e.g., m-axis flat orientation and no compensation in rotation for laser process) can lead to formation of a honeycomb structure, instead of triangular μ-rods.

By etching hexagonal arrays of laser drilled holes with heated 5% TMAH, triangular g-rods with controlled crystallographic faces are formed. The laser process has a much wider depth of field than lithographic processes, bypassing the issues associated with wafer bowing from thermal stress. The anisotropic TMAH etch is selective to the c-plane, as well as to the m-planes. This permits the formation of triangles with the c-plane (0001) at the end, and nm-planes (1100) on all three vertical sides.

A similar structure is possible through conventional VLS growth of GaN nanowires (Nano Let., v. 6, n. 8, 2006, p. 1808), with the sides aligned to the family of m-axes, and the top aligned to the c-axis. However, these are reported to be hexagonal in shape and require very high temperature MOCVD processes (1050° C.) for the growth. The hexagonal structure can cause reentrant regions that make some aspects of LED fabrication more difficult.

Figure 20A:
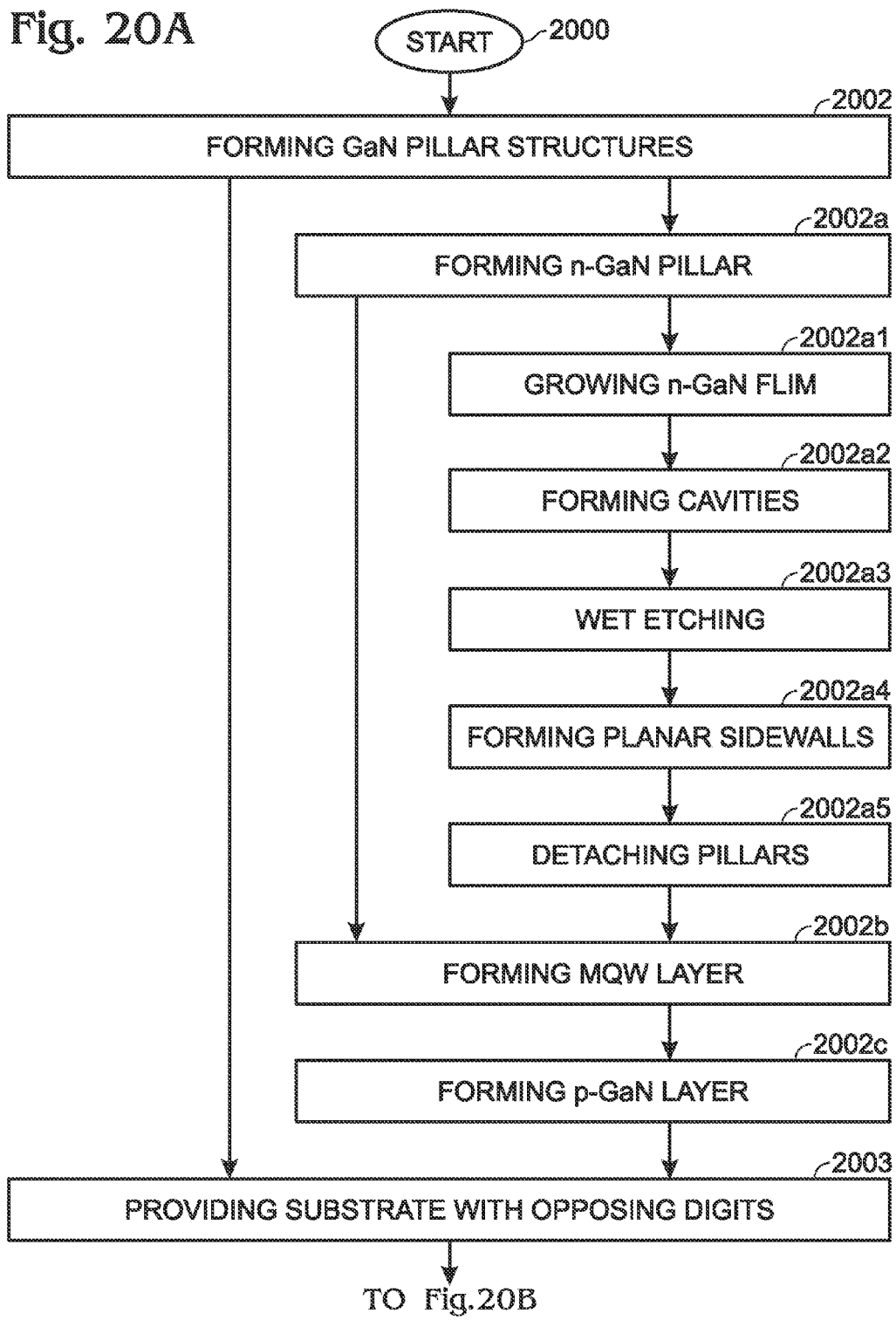

FIG. 20 is a flowchart illustrating a method for fabricating a LED using three-dimensional GaN pillar structures with planar surfaces. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 2000.

Step 2002 forms a plurality of GaN pillar structures, each GaN pillar structure being formed with the following substeps. Step 2002a forms an n-GaN pillar having a first end, a second end, with at least one of the ends formed in a c-plane. The n-GaN pillar is formed with planar sidewalls perpendicular to the c-plane, formed in either an m-plane or a-plane family. The n-doped GaN pillars have a hexagonal or triangular shape. Step 2002b forms a MQW layer overlying the n-GaN pillar sidewalls. Step 2002c forms a layer of p-GaN overlying the MQW layer. Step 2004 deposits the plurality of GaN pillar structures on a first substrate, with the n-doped GaN pillar sidewalls aligned parallel to a top surface of the first substrate. Step 2006 connects a first end of each GaN pillar structure to a first metal layer to form a first electrode. Step 2008 etches a second end of each GaN pillar structure to expose the n-GaN pillar second end. Step 2010 connects the second end of each GaN pillar structure to a second metal layer to form a second electrode.

In one aspect, forming the n-doped GaN pillars in Step 2002a includes the following substeps. Step 2002a1 grows an n-doped GaN film overlying a second substrate. Step 2002a2 forms cavities in a top surface of the GaN film. Step 2002a3 wet etches the cavities in the GaN film top surface. Step 2002a4 forms planar sidewalls extending into the GaN film that are perpendicular to a c-plane aligned with the GaN top surface. Step 2002a5 detaches the first end of each GaN pillar from the second substrate. In one aspect, forming the MQW layer (Step 2002b) and forming the p-GaN (Step 2002c) are performed prior to detaching the first end of each GaN pillar from the second substrate in Step 2002a5.

In one aspect Step 2003 provides the first substrate top surface with a plurality of first electrode digits and a plurality of opposing second electrode digits. Then, depositing the plurality of GaN pillar structures on the first substrate in Step 2004 includes the following substeps. Step 2004a suspends the GaN pillar structures in an ink solution. Step 2004b flows the ink solution over the first substrate top surface. Step 2004c creates an alternating current (AC) electric field with a first field strength between each first electrode digit and corresponding second electrode digit. In response to the electric field, Step 2004d bridges a gap between each first electrode digit and corresponding second electrode digit with a GaN pillar structure. Subsequent to bridging the gap between first and second electrode digits with the GaN pillar structure, Step 2004e increases the electric field strength to capture the GaN pillar structures. Step 2004f flows a solvent over the first substrate top surface. In response to the solvent flow, Step 2004g removes GaN pillar structures not captured by the electric field.

In one aspect, connecting the first end of each GaN pillar structure to a first metal layer in Step 2006 includes the following substeps. Step 2006a conformally deposits a Ni layer overlying the first substrate top surface and GaN pillar structures. Step 2006b conformally deposits a transparent conductor overlying the Ni layer. Then, prior to etching the second end of each GaN pillar structure, Step 2008 etches to remove the transparent conductor and Ni layers overlying the second end of each GaN pillar structure. Step 2010 connects the second end of each GaN pillar structure to the second metal layer by depositing a metal interconnect layer overlying the exposed n-GaN to connect to the second metal layer.

FIG. 15 is a flowchart illustrating an alternative method for fabricating a LED using three-dimensional GaN pillar structures with planar surfaces. The method starts at Step 2100. Step 2102 grows an n-GaN film overlying a substrate. Step 2104 forms a plurality of openings in a first region of the n-GaN film. Typically, the openings have a hexagonal shape. Each opening has planar sidewalls perpendicular to a c-plane aligned with a top surface of the n-GaN film, and they are formed in either an m-plane or a-plane family. Step 2106 forms a MQW layer overlying the first region of n-GaN film. Step 2108 forms a layer of p-GaN overlying the MQW layer. Step 2110 deposits a first metal layer overlying a second region of the n-GaN film forming a first electrode. Step 2112 deposits a second metal layer overlying the p-GaN film to form a second electrode.

In one aspect, forming the plurality of openings in the n-GaN film in Step 2104 includes substeps. Step 2104a forms cavities in the top surface of the n-GaN film. Step 2104b wet etches the cavities in the n-GaN film top surface. Step 2104c forms planar sidewalls extending into the n-GaN film.

A LED made from GaN 3D planar structures and associated fabrication processes have been provided. Examples of particular process steps have been presented to illustrate the invention. However, the invention is not limited to merely these examples. Other variations and embodiments of the invention will occur to those skilled in the art.

We claim:

1. A method for fabricating a light emitting diode (LED) using three-dimensional gallium nitride (GaN) pillar structures with planar surfaces, the method comprising:

growing an n-doped GaN (n-GaN) film overlying a substrate;

forming a plurality of openings in a first region of the n-GaN film, each opening having planar sidewalls perpendicular to a c-plane aligned with a top surface of the n-GaN film, and formed in a plane selected from a group consisting of an in-plane and a-plane family;

forming a multiple quantum well (MQW) layer overlying the first region of n-GaN film, including the planar sidewalls of the openings;

forming a layer of p-doped GaN (p-GaN) overlying the MQW layer;

depositing a first metal layer overlying a second region of the n-GaN film forming a first electrode; and, depositing a second metal layer overlying the p-GaN film to form a second electrode.

2. The method of claim 1 wherein forming the plurality of openings in the n-GaN film includes forming openings having a hexagonal shape.

3. The method of claim 1 wherein forming the plurality of openings in the n-GaN film includes:

forming cavities in the top surface of the n-GaN film;

wet etching the cavities in the n-GaN film top surface; and, forming planar sidewalls extending into the n-GaN film.

4. A light emitting diode (LED) with three-dimensional gallium nitride (GaN) pillar structures having planar surfaces, the LED comprising:

an n-doped GaN (n-GaN) film overlying a substrate, having a first region with a plurality of openings and a second region, each opening having planar sidewalls perpendicular to a c-plane aligned with a top surface of the n-GaN film, and formed in a plane selected from a group consisting of a m-plane family and an a-plane family;

a multiple quantum well (MQW) layer overlying the n-GaN film first region, including the planar sidewalls of the openings;

a layer of p-doped GaN (p-GaN) overlying the MQW layer;

a first metal layer overlying the second region of n-GaN film forming a first electrode; and, a second metal layer overlying the p-GaN film to form a second electrode.

5. The LED of claim 4 wherein the plurality of openings in the n-GaN film each have a hexagonal shape.

6. The method of claim 3 wherein forming cavities in the top surface of the n-GaN film includes using a process selects from a group consisting of plasma dry etching and laser ablation.

7. A method for fabricating a light emitting diode (LED) using three-dimensional gallium nitride (GaN) pillar structures with planar surfaces, the method comprising:

growing an n-doped GaN (n-GaN) film overlying a substrate;

generating a pattern of dislocation defects in a top surface of the n-GaN film;

wet etching the dislocation defects in the n-GaN film to remove n-GaN material damages in response to forming the dislocation defects;

stopping the removal of n-GaN material in response to encountering planes selected from a group consisting of c-planes, m-planes, and a-planes;

forming a plurality of openings in a first region of the n-GaN film, each opening having planar sidewalls perpendicular to a c-plane aligned with a top surface of the n-GaN film, and formed in a plane selected from a group consisting of an in-plane and a-plane family;

forming a multiple quantum well (MQW) layer overlying the first region of n-GaN film, including the planar sidewalls of the openings;

forming a layer of p-doped GaN (p (a) overlying the MQW layer;

depositing a first metal layer overlying a second region of the n-GaN film forming a first electrode; and, depositing a second metal layer overlying the p-GaN film to form a second electrode.

8. The method of claim 7 wherein forming the plurality of openings in the n-GaN film includes forming openings having a hexagonal shape.

9. The method of claim 7 wherein forming dislocation defects in the top surface of the n-GaN film includes using a process selects from a group consisting of plasma dry etching and laser ablation.

* * * * *

UNITED STATES PATENT AND TRADEMARK OFFICE
CERTIFICATE OF CORRECTION

PATENT NO. : 9,018,081 B2  
APPLICATION NO. : 14/088374  
DATED : April 28, 2015  
INVENTOR(S) : Mark Albert Crowder et al.

Page 1 of 1

It is certified that error appears in the above-identified patent and that said Letters Patent is hereby corrected as shown below:

In the Claims

Column 14, line 3, claim 1, the term "m-plane" has been incorrectly printed as --in-plane--.

Column 14, line 64, claim 7, the term "m-plane" has been incorrectly printed as --in-plane--.

Column 15, line 1, claim 7, the term "(p-GaN)" has been incorrectly printed as --(p (a)--.

Signed and Sealed this  
Eleventh Day of August, 2015

Michelle K. Lee  
*Director of the United States Patent and Trademark Office*